United States Patent
Ho

(10) Patent No.: US 7,257,019 B2
(45) Date of Patent: Aug. 14, 2007

(54) SYSTEMS AND METHODS FOR A MAGNETIC MEMORY DEVICE THAT INCLUDES A SINGLE WORD LINE TRANSISTOR

(75) Inventor: ChiaHua Ho, Kaohsiung (TW)

(73) Assignee: Macronix International Co., Ltd. (TW)

( * ) Notice: Subject to any disclaimer, the term of this patent is extended or adjusted under 35 U.S.C. 154(b) by 78 days.

(21) Appl. No.: 11/281,027

(22) Filed: Nov. 17, 2005

(65) Prior Publication Data

US 2007/0109853 A1    May 17, 2007

(51) Int. Cl.
*G11C 11/00* (2006.01)
*G11C 7/00* (2006.01)
(52) U.S. Cl. .................. 365/158; 385/185.18; 385/171
(58) Field of Classification Search ............... 365/158, 365/185.18, 63, 171
See application file for complete search history.

(56) References Cited

U.S. PATENT DOCUMENTS

| 5,640,343 | A | 6/1997 | Gallagher et al. |
| 6,174,737 | B1 | 1/2001 | Durlam et al. |
| 6,545,906 | B1 | 4/2003 | Savtchenko et al. |
| 6,781,874 | B2 * | 8/2004 | Hidaka .......... 365/171 |
| 7,164,598 | B2 * | 1/2007 | Jeong et al. ........ 365/158 |

* cited by examiner

*Primary Examiner*—Son Dinh
(74) *Attorney, Agent, or Firm*—Baker & McKenzie LLP

(57) ABSTRACT

An MRAM cell comprises a magnetic metal layer and a magnetic sensing device in close proximity to the magnetic metal layer. One end of the magnetic metal layer is coupled with a word line transistor and a diode is included and configured to couple the magnetic sensing device to a bit line. The magnetic metal layer can be used to both program and read the cell, eliminating the need for a second current line in the cell.

31 Claims, 20 Drawing Sheets

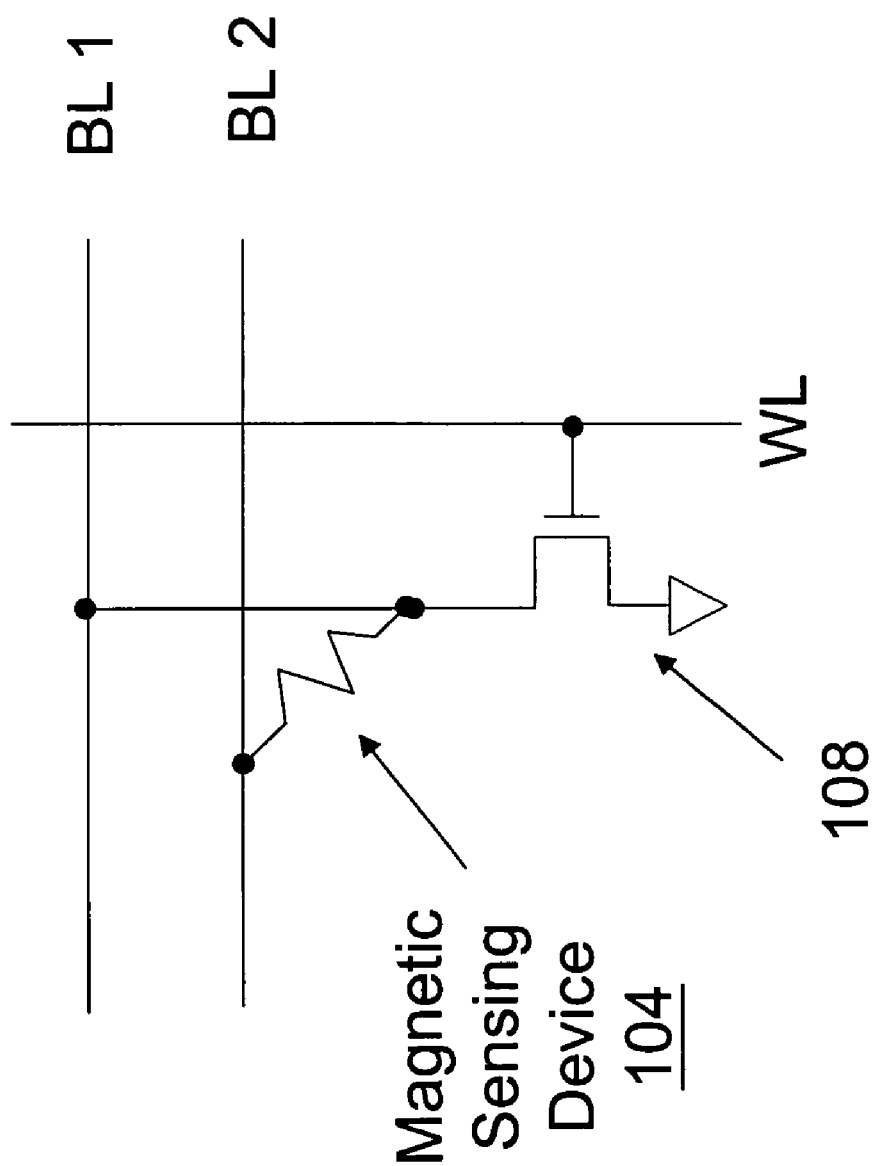

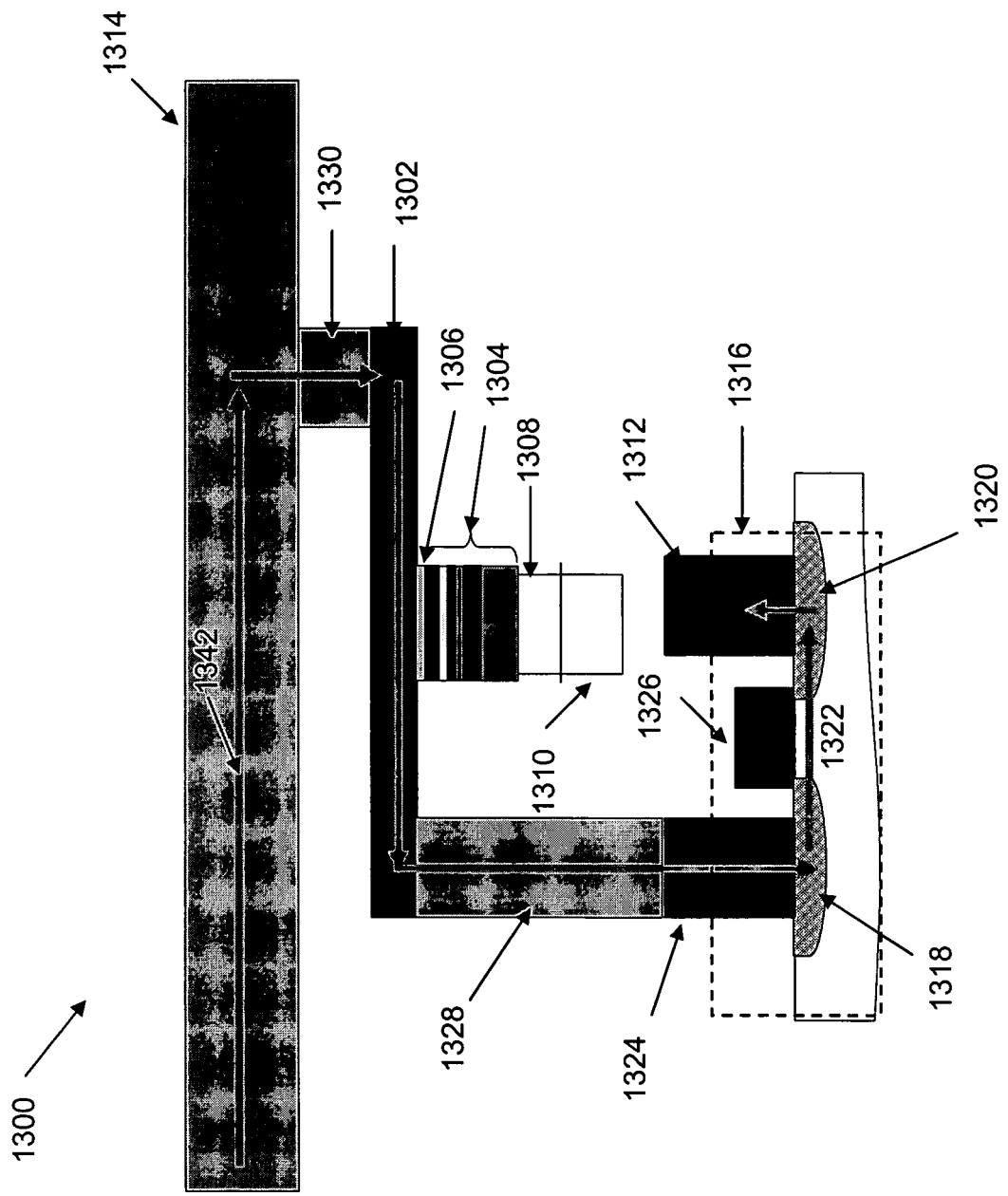

SYSTEMS AND METHODS FOR A MAGNETIC MEMORY DEVICE THAT INCLUDES A SINGLE WORD LINE TRANSISTOR

RELATED APPLICATION INFORMATION

This application is related to co-pending U.S. patent application Ser. No. 11/255,606, entitled, "A Magnetic Memory Device and Methods for Making a Magnetic Memory Device," filed Oct. 21, 2005, U.S. patent application Ser. No. 11/281,658, entitled, "Systems and Methods for Reading and Writing a Magnetic Memory Device," filed Nov. 17, 2005, and U.S. patent application Ser. No. 11/281,018, entitled, "Systems and Methods for a Magnetic Memory Device Comprising Two Word Line Transistor," filed Nov. 17, 2005, each of which are incorporated herein in the entirety as if set forth in full.

BACKGROUND

1. Field of the Invention

The invention relates in general to memory devices for use as computer main storage, and in particular to memory arrays that use magnetic memory elements as the individual memory cells.

2. Background of the Invention

The desired characteristics of a memory cell for computer main memory are high speed, low power, nonvolatility, and low cost. Low cost is accomplished by a simple fabrication process and a small surface area. Dynamic random access memory (DRAM) cells are fast and expend little power, but have to be refreshed many times each second and require complex structures to incorporate a capacitor in each cell. Flash type EEPROM cells are nonvolatile, have low sensing power, and can be constructed as a single device, but take microseconds to write and milliseconds to erase, which makes them too slow for many applications, especially for use in computer main memory. Conventional semiconductor memory cells such as DRAM, ROM, and EEPROM have current flow in the plane of the cell, i.e., "horizontal", and therefore occupy a total surface area that is the sum of the essential memory cell area plus the area for the electrical contact regions, and therefore do not achieve the theoretical minimum cell area.

Unlike DRAM, magnetic memory cells that store information as the orientation of magnetization of a ferromagnetic region can hold stored information for long periods of time, and are thus nonvolatile. Certain types of magnetic memory cells that use the magnetic state to alter the electrical resistance of the materials near the ferromagnetic region are collectively known as magnetoresistive (MR) memory cells. An array of magnetic memory cells is often called magnetic RAM or MRAM.

To be commercially practical MRAM should have comparable memory density to current memory technologies, be scalable for future generations, operate at low voltages, have low power consumption, and have competitive read/write speeds.

For an MRAM device, the stability of the nonvolatile memory state, the repeatability of the read/write cycles, and the memory element-to-element switching field uniformity are three of the most important aspects of its design characteristics. A memory state in MRAM is not maintained by power, but rather by the direction of the magnetic moment vector. Storing data is accomplished by applying magnetic fields and causing a magnetic material in a MRAM device to be magnetized into either of two possible memory states. Recalling data is accomplished by sensing the resistive differences in the MRAM device between the two states. The magnetic fields for writing are created by passing currents through strip lines external to the magnetic structure or through the magnetic structures themselves.

As the lateral dimension of an MRAM device decreases, three problems occur. First, the switching field increases for a given shape and film thickness, requiring a larger magnetic field to switch. Second, the total switching volume is reduced so that the energy barrier for reversal decreases. The energy barrier refers to the amount of energy needed to switch the magnetic moment vector from one state to the other. The energy barrier determines the data retention and error rate of the MRAM device and unintended reversals can occur due to thermofluctuations (superparamagnetism) if the barrier is too small. A major problem with having a small energy barrier is that it becomes extremely difficult to selectively switch one MRAM device in an array. Selectability allows switching without inadvertently switching other MRAM devices. Finally, because the switching field is produced by shape, the switching field becomes more sensitive to shape variations as the MRAM device decreases in size. With photolithography scaling becoming more difficult at smaller dimensions, MRAM devices will have difficulty maintaining tight switching distributions.

These problems often associated with conventional MRAM devices result in other problems. For example, it takes high currents in order to change the state of the magnetic sensing device in order to program a conventional MRAM device. These high currents create several problems including high power consumption which makes MRAM devices unsuitable for many portable applications. Moreover, the magnetic field resulting from the currents is often difficult to control which leads to cross talk problems especially in MRAM devices with decreased lateral dimensions as described above.

SUMMARY

An MRAM cell comprises a magnetic metal layer and a magnetic sensing device in close proximity to the magnetic metal layer. One end of the magnetic metal layer is coupled with a word line transistor, while the other end of the magnetic metal layer is coupled to a first bit line. The magnetic sensing device can be coupled with a second bit line via a diode.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which:

FIG. 1B is a diagram illustrating a schematic equivalent of the MRAM cell of FIG. 1A;

FIG. 19 is a diagram illustrating an example method for programming the MRAM cell of FIG. 13 to a second state in accordance with one embodiment.

DETAILED DESCRIPTION OF THE PREFERRED EMBODIMENTS

Figure 1A:
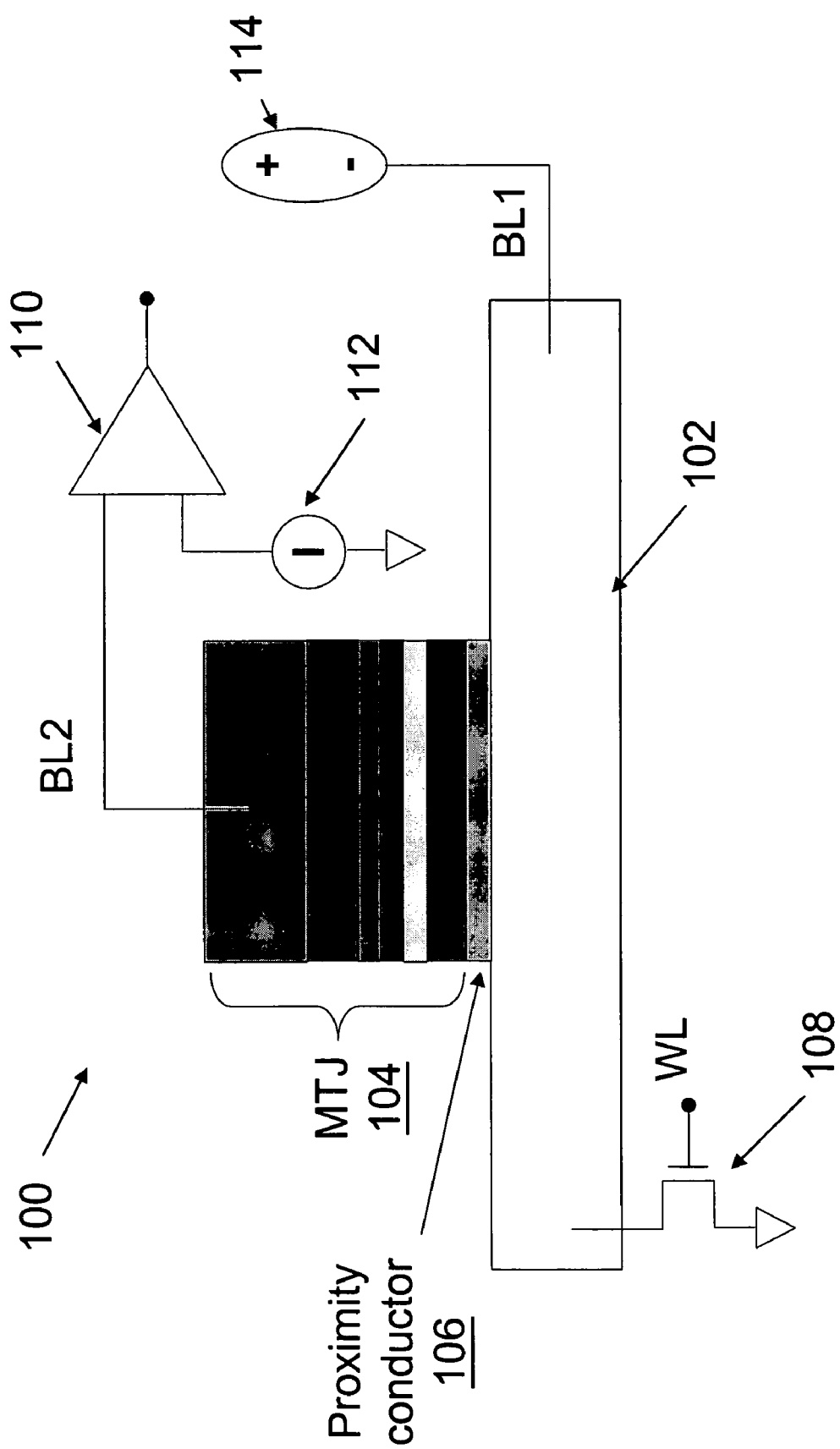
FIG. 1A is a diagram illustrating an example MRAM cell structure configured in accordance with one embodiment.

FIG. 1A is a diagram illustrating an example embodiment of an MRAM cell 100 that can be included in an MRAM device configured in accordance with one embodiment of the systems' methods described herein. It will be apparent that not all the layers, structures, and/or circuits included in MRAM cell 100, or the MRAM device in which MRAM cell 100 is included, are illustrated in FIG. 1A. Only certain elements, layers, and/or aspects associated with MRAM cell 100 are shown in FIG. 1A for the sake of convenience. Methods for fabricating an MRAM device that includes an MRAM cell 100 are described in detail in co-pending patent application Ser. No. 11/255,606. The description of the 11/255,606 application describes in detail the layers comprising an MRAM device that includes MRAM cell 100 and methods for fabricating the layers and other circuits. Thus, while not all of the layers, elements, and circuits associated with MRAM cell 100 are illustrated in FIG. 1A, this should not be seen as limiting MRAM cell 100 to any particular construction or as excluding any of these various layers, elements, and/or circuits. Further, While the layers illustrated in FIG. 1A are shown in two dimensions, it will be clear that the layers are actually three-dimensional.

As can be seen, MRAM cell 100 includes a magnetic metal layer 102 and a magnetic sensing device 104 in close proximity to magnetic metal layer 102. Magnetic sensing device 104 is separated from magnetic metal layer 102 and certain embodiments, via a proximity conductor layer 106. Magnetic metal layer 102 can have an associated length, height, and width that can range anywhere from 10 nm to 10 μm. Similarly, magnetic sensing device 104 can have an associated length, height, and width that can range anywhere from 5 nm to 10 μm depending on the embodiment.

Magnetic metal layer 102 can have a permeability in the range from about 10 to $10^8$. Magnetic metal layer 102 is conductive and has a resistivity ($\rho$) that ranges from about 4 μΩ-cm to $10^8$ μΩ-cm. Magnetic metal layer 102 can also have a saturation magnetization ($M_s$) that ranges from about 10 Guass to 2.5 Tesla. The material used to construct magnetic metal layer 102 can include at least one element with a crystallization phase. For example, magnetic metal layer 102 can include Ni, Fe, Co, B, Mo, Zn, Pb, Si, C, O, and/or any other material that can provide the $\rho$ and $M_s$ described above.

Proximity conductor 106 can be configured to connect magnetic sensing device 104 and magnetic metal layer 102. The resistivity ($\rho$) of proximity conductor 106 can be in the range of about 1 to $10^{10}$ μΩ-cm. Proximity conductor 106 can be metal, a conductive compound, semi-conductor material, or any other material that has a resistivity within the range described above. These materials can include, for example, Cu, TiN, TaN, Si, W, Ag, Ru, Ir, Pt, etc.

Magnetic sensing device 104 can include a single or multi-layer layer ferro/anti-ferro magnetic device. Such magnetic devices can include, for example, a Magnetic Tunnel Junction (MTJ) device, a Giant Magneto Resistance (GMR) device, a Colossal Magneto Resistance (CMR) device, or an Anisotropic Magneto Resistance (AMR) device, Magneto Optical (MO) element, or magnetic disc. For example, magnetic sensing device 104 can include an MTJ device comprising of a ferromagnetic layer, an insulator, another ferromagnetic layer, and an anti-ferromagnetic layer. Alternatively, magnetic sensing device 104 can include an MTJ device that includes a ferromagnetic layer, an insulator layer, and another ferromagnetic layer, or an MTJ device that includes an anti-ferromagnetic layer, a ferromagnetic layer, an insulator, and another ferromagnetic layer.

In other embodiments, magnetic sensing device 104 can include a GMR device that includes a ferromagnetic layer, a thin conductive layer, another ferromagnetic layer, and an anti-ferromagnetic layer. Alternative GMR devices that can be used in conjunction with the systems and methods described herein can include a ferromagnetic layer, a thin conductive layer, and another ferromagnetic layer, or an anti-ferromagnetic layer, a ferromagnetic layer, a thin conductive layer, and another ferromagnetic layer.

Alternatively, a CMR device comprising a Mn-based compound with at least two elements, such as LaSrMnO, PrCaMnO, LaCaMnO, etc., can be used for magnetic sensing device 104. In still other embodiments, an AMR device, MO elements, or a magnetic disc comprising third transition ferromagnetic elements or alloys with other elements can be used for magnetic sensing device 104.

The ferromagnetic layers referred to above can, depending on the embodiment, include 3d transition ferromagnetic elements or alloys with other elements such as CoFe, NiFe, CoFeB, Fe, Co, etc. The anti-ferromagnetic layers described above can include transition anti-ferromagnetic elements or alloys with other elements, such as FeMn, IrMn, NiO, PtMn, NiMn, CoO, etc. Other anti-ferromagnetic layers referred to above can include ferromagnetic anti-layers with or without anti-ferromagnetic material, such as CoFe/Ru/CoFe, CoFe/Ru/CoFe/IrMn, etc. Insulator layers referred to above can include elements such as Al2O3, MgO, etc., and the thin conductive layers described above, can include materials such as Cu, Ag, Cr, Ru, Ir, etc.

It will be understood that the devices, layers, and materials described above are by way of example only and should not be seen as limiting the systems and methods described herein to any particular device structure and/or materials. Further, the high permeability conductive element, or line can comprise a non-circular cross section. This allows the magnetic field to pass from one side of the high permeability element to the other. For example, the cross-sectional area can be polygon shape.

The magnetoresistive memory cell can then be located in a region between the neighboring two corners, or left and right edges of the high permeability conductive line.

As will be described in more detail below, magnetic metal layer 102 can be used to conduct currents that create magnetic fields that can be used to program magnetic sensing device 104 to one of two states. Further, magnetic metal layer 102 can be used to conduct currents that enable the state of magnetic sensing device 104 to be determined. By using magnetic layer 102 to conduct read and write currents in this manner, lower current levels can be used in the read and write operations as compared to conventional devices. Further, the low currents in magnetic layer 102 reduces and can even eliminate any cross talking problems. Moreover, the number of metal bit lines can be reduced relative to conventional MRAM devices, which allows for greater reduction in size and increase densities.

Figure 2:
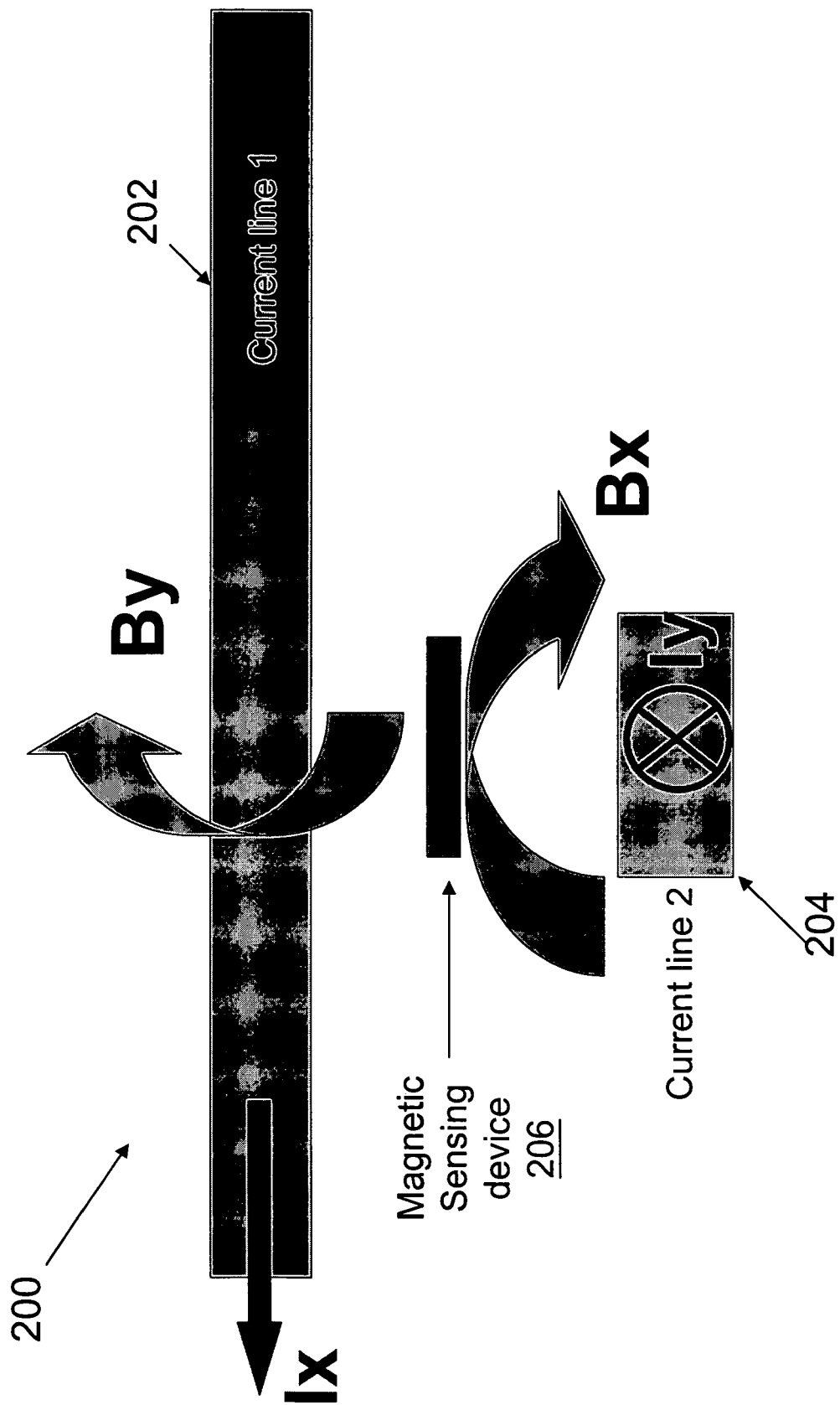
FIG. 2 is a diagram illustrating the current lines and magnetic sensing device for a conventional MRAM device.

FIG. 2 is a diagram illustrating the current lines 202 and 204 and magnetic sensing device 206 for an exemplary MRAM cell 200. As explained above, magnetic sensing device 206 comprises magnetic material that can be configured to store information as the orientation of the magnetization of a ferromagnetic region within magnetic sensing device 206. The orientation of the magnetization can be effected by magnetic fields By and Bx that result from current flowing through current lines 202 and 204.

Current lines 202 and 204 are typically constructed from non-magnetic materials, such as Cu. Magnetic fields By and Bx generated by currents Ix and Iy flowing through current lines 202 and 204 are generated in accordance with Ampere's law. If the sum of the magnetic fields (Bx+By) is greater than the coercive field of magnetic sensing device 206, then magnetic sensing device 206 can be programmed to one of two programming states.

For example, when currents Ix and Iy are flowing in the directions shown, i.e., from right to left and into the page, and the currents are sufficient magnitude such that Bx+By is greater than the coercive field of magnetic sensing device 206, then the magnetic moment vector for magnetic sensing device 206 can be switched to one of the two programming states. Reversal of the directions for currents Ix and Iy will then switch the magnetic moment vector in the other direction programming magnetic sensing device 206 to the other of the two programming states.

Unfortunately, in part because current lines 202 and 204 are constructed from non-magnetic materials, it takes large amounts of current, i.e., several mA to several tens of mA, to generate sufficient magnetic fields Bx and By to overcome the energy barrier from magnetic sensing device 206. Further, the distribution of magnetic fields By and Bx cannot be controlled sufficiently to avoid cross talk between cells.

Figure 3:
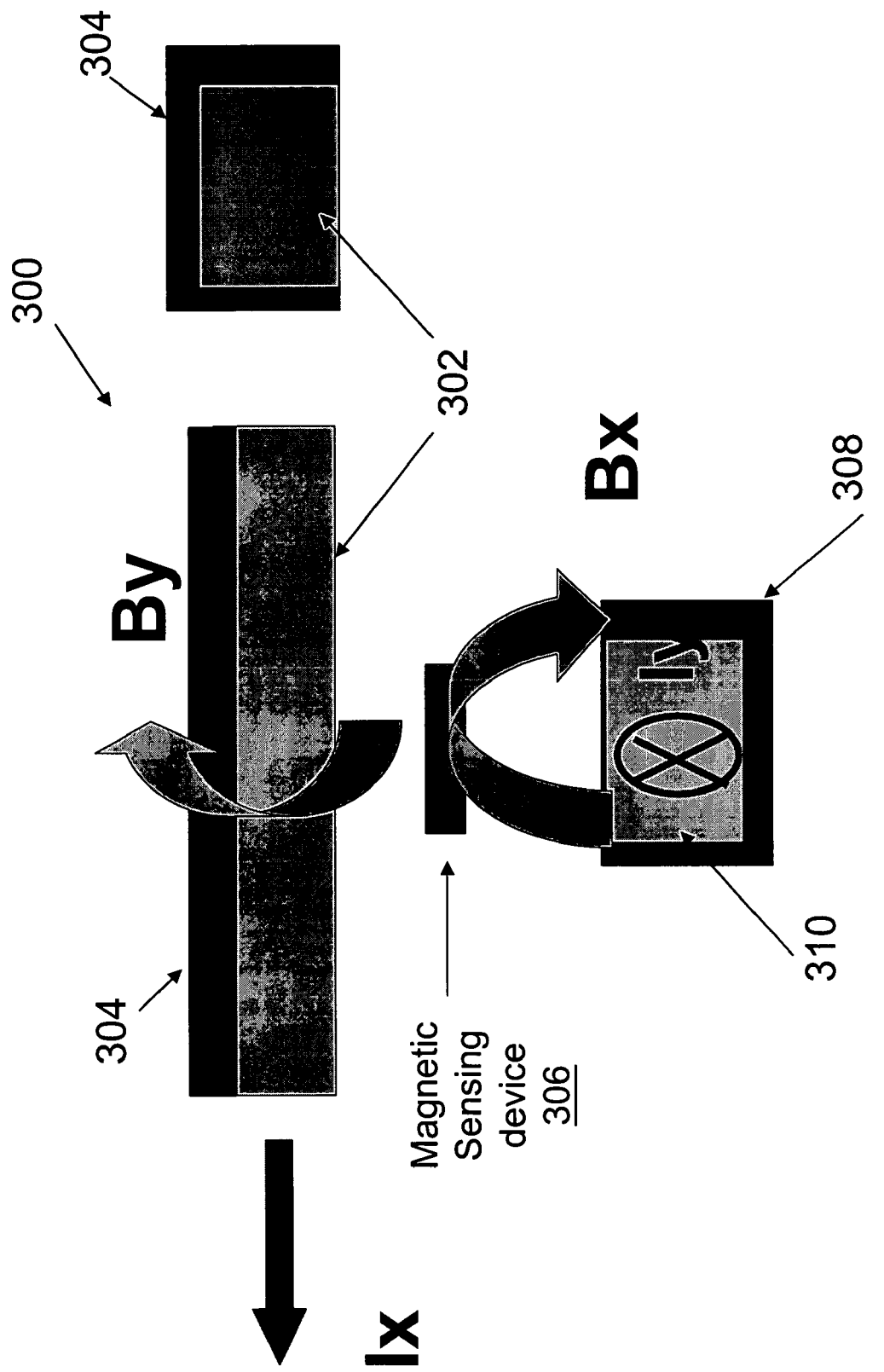
FIG. 3 is a diagram illustrating the current lines and magnetic sensing device for another conventional MRAM cell.

In the example of FIG. 3, which illustrates the current lines 302 and 310 and magnetic sensing device 306 for another exemplary MRAM cell, current lines 302 and 310 are surrounded by magnetic material 304 and 308. For current line 302 this is illustrated by the side view on the right of FIG. 3. MRAM cell 300 operates in the same fashion as MRAM cell 200; however, due to the resistivity (ρ) difference between current lines 302 and 310 and the magnetic material 304 and 308 surrounding current lines 302 and 310 respectively, most of the current Ix and Iy flows through the non-magnetic material of current lines 302 and 310. In addition, due to the confining operation of magnetic material 304 and 308, which can be referred to as magnetic clamps, the magnetic fields Bx and By generated by currents Iy and Ix respectively, are confined and the distribution is better controlled. Essentially, magnetic clamps 304 and 308 act as U-shaped magnets surrounding current lines 302 and 310. Thus, most of magnetic fields Bx and By are focused within clamps 304 and 308.

For the cell of FIG. 3, currents Ix and Iy, required to program magnetic sensing device 306 and MRAM cell 300, are less than those required for MRAM cell 200; however, several mA are still required. Problems with cross talking are also improved, but the device of FIG. 3 is more complicated to manufacture than that of FIG. 2.

Figure 4:
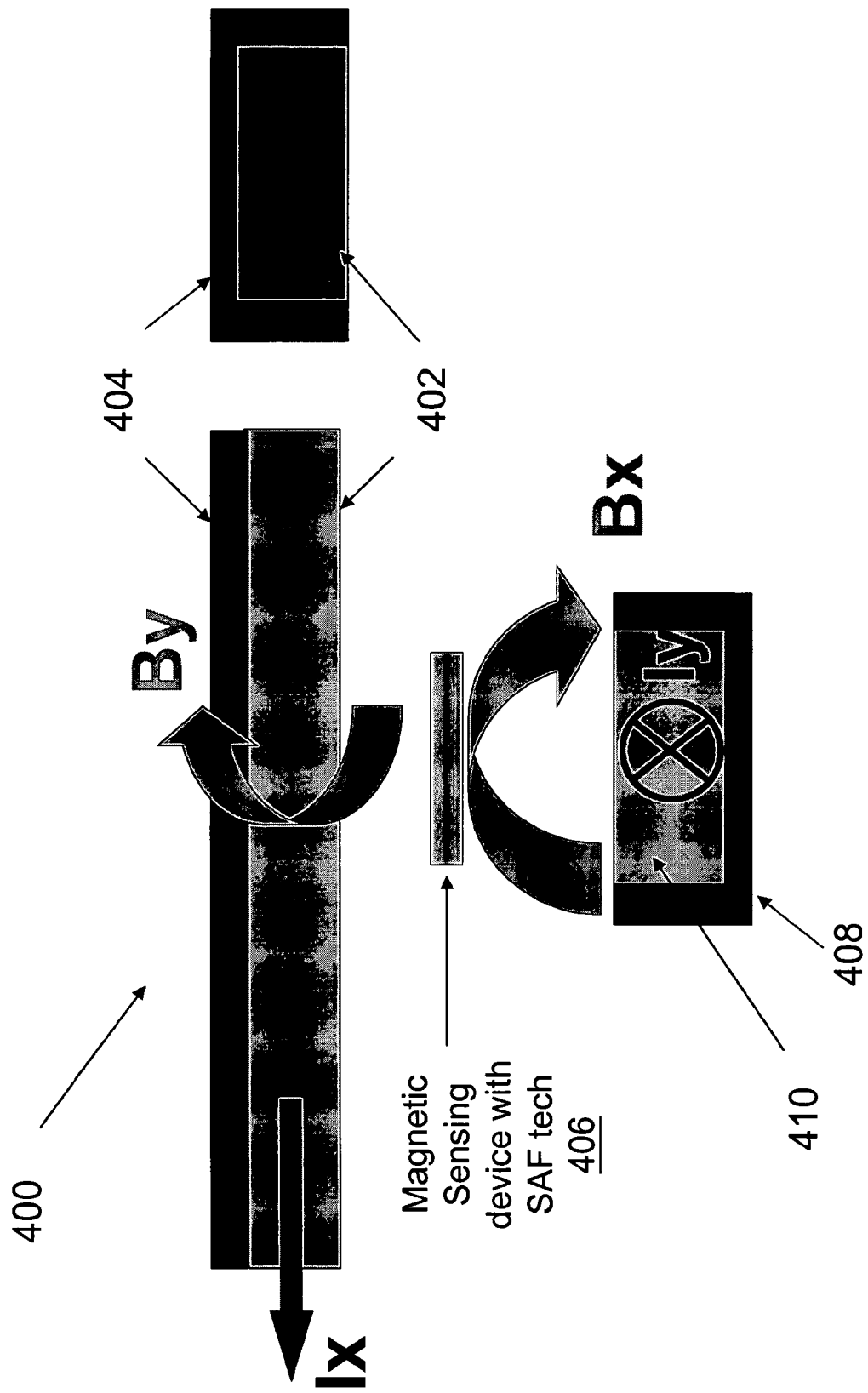
FIG. 4 is a diagram illustrating the current lines and magnetic sensing device for still another conventional MRAM cell.

FIG. 4 is a diagram illustrating the current lines 402 and 410 and magnetic sensing device 406 for still another exemplary MRAM cell 400. As with MRAM cell 300, current lines 402 and 410 are clamped by magnetic material 404 and 408. Here however magnetic sensing device 406 uses Synthetic Antiferromagnetic Coupling (SAF). In order to use SAF coupling, magnetic sensing device 406 is constructed from a plurality of layers. These layers include a first ferromagnetic layer, a very thin conductive layer, e.g., approximately 0.7 nm, and a second ferromagnetic layer. Further, currents Ix and Iy are pulsed on different time sequences. The differential pulsing switches the magnetization of the first and second ferromagnetic layers at different times. If the magnetization of both the first and the second ferromagnetic layers are switched then magnetic sensing device 406 is programmed to one of the two programming states. If the magnetization is not switched, then magnetic sensing device 406 remains programmed to its current state.

Use of SAF technology is effective for eliminating cross talk; however, very large currents are typically required to program magnetic sensing device 406. For example, several tens of mA are required in order to change the state of magnetic sensing device 406. In addition, the very thin conductive layer required for magnetic sensing device 406 can be very difficult to manufacture and control. If the thickness of the thin conductive layer varies too much, then the cell will not operate correctly.

Moreover, each of the cells illustrated in FIGS. 24 require two current lines to program the magnetic sensing device included therein. Conversely, in cell 100, only magnetic metal layer 102 is needed to program magnetic sensing device 104. Thus, one current line can be eliminated by implementing the structure illustrated in FIG. 1.

Figure 5:
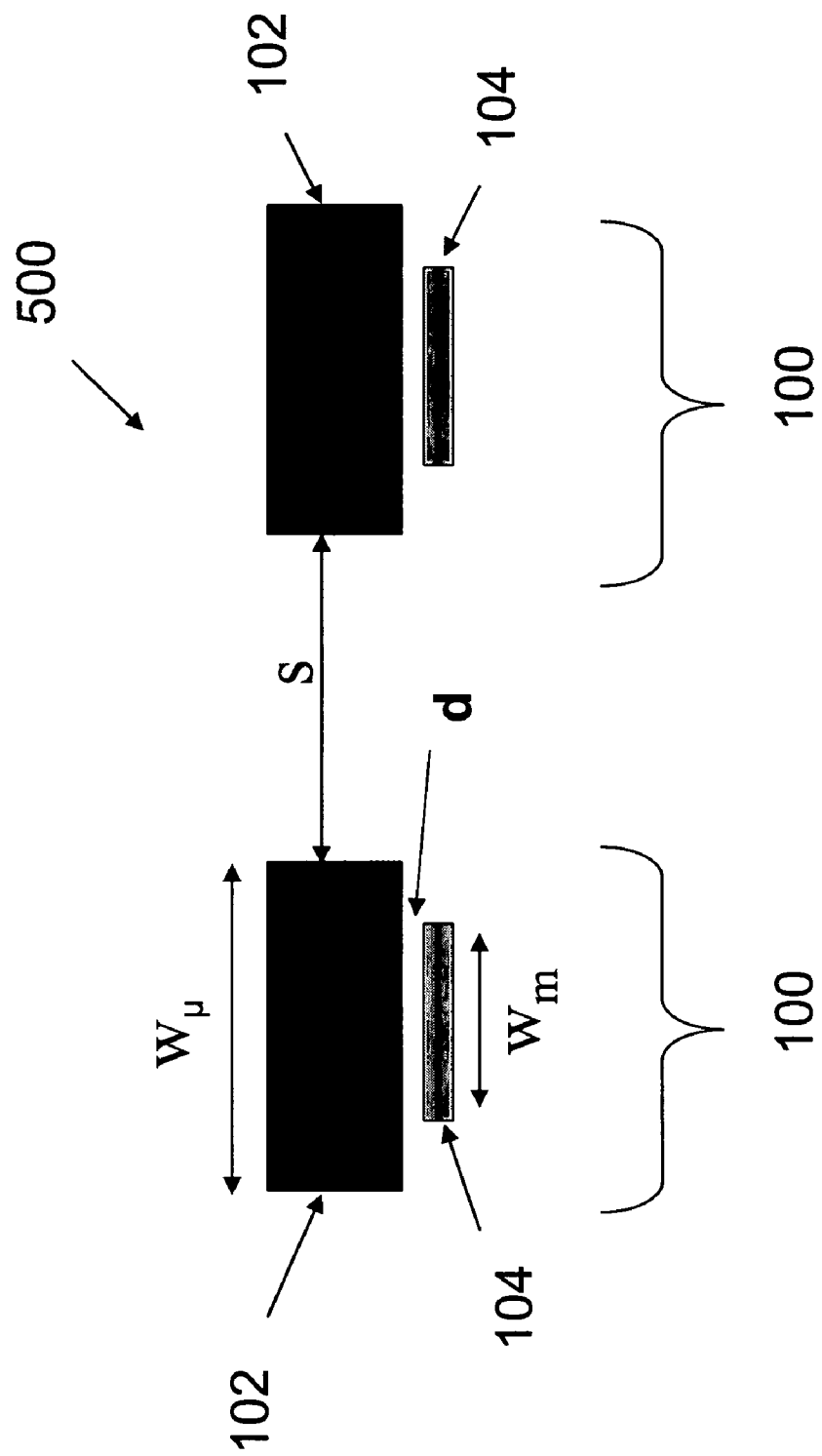
FIG. 5 is a diagram illustrating one embodiment of an MRAM device including MRAM cells, such as the MRAM cell of FIG. 1A.

FIG. 5 is a diagram illustrating a side view of an MRAM device 500 comprising two exemplary MRAM cells 100. FIG. 5 illustrates some key dimensions related to MRAM cells 100 including the width ($W_\mu$) of magnetic metal layers 102, the width ($W_m$) of magnetic sensing device 104, the distance (d) between magnetic sensing device 104 and magnetic metal layer 102, and the spacing (S) between magnetic metal layers 102. Example ranges for these various dimensions were provided above.

Figure 6:
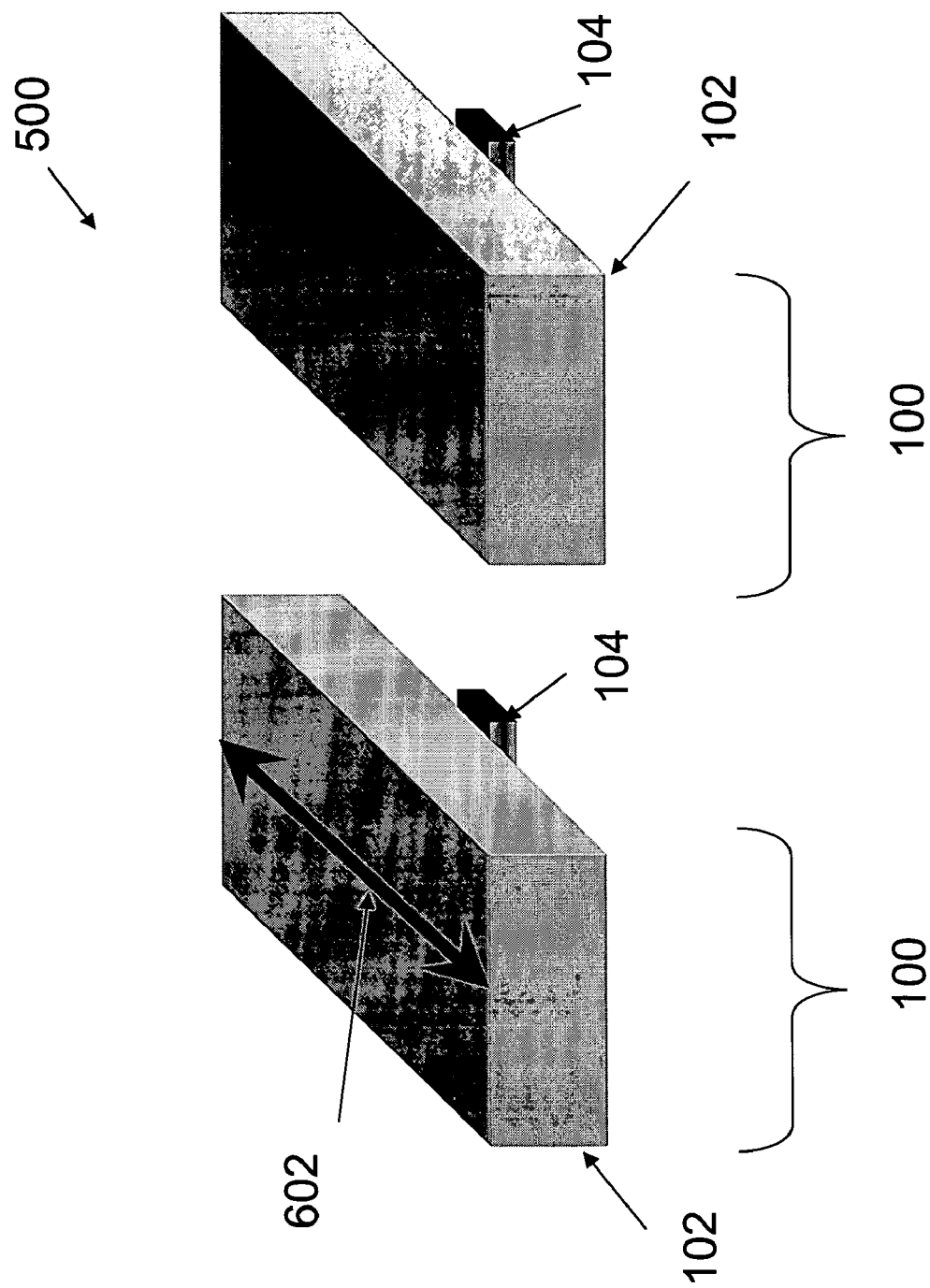
FIG. 6 is a diagram illustrating an exemplary writing current for the MRAM cells included in the MRAM device of FIG. 5.
Figure 7:
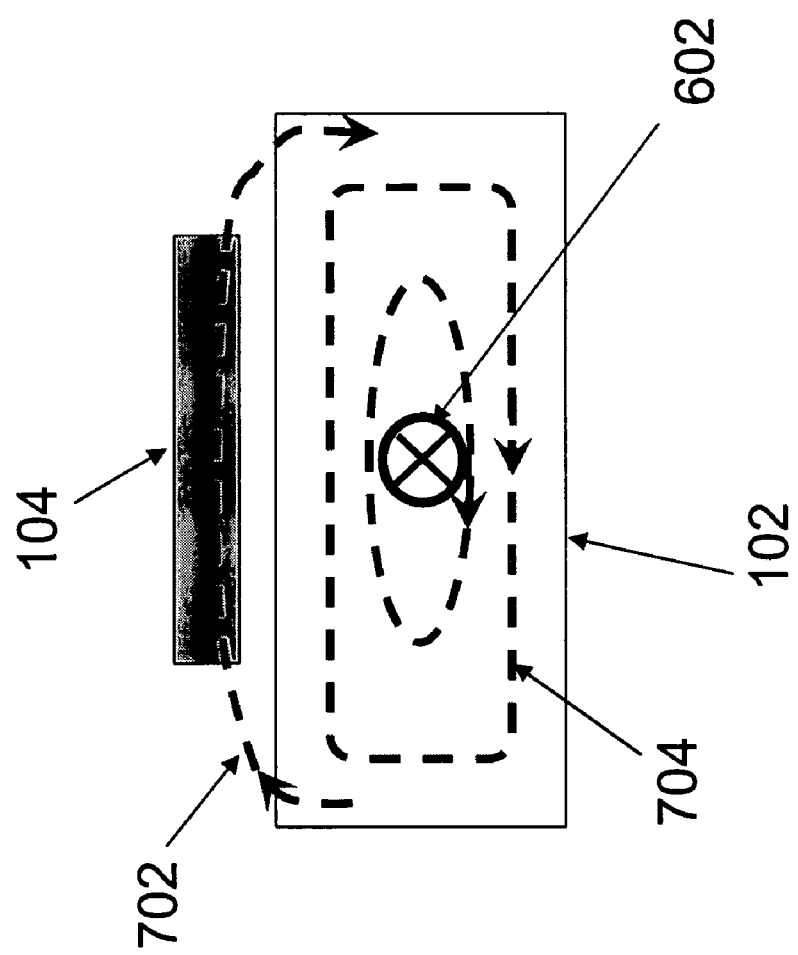
FIG. 7 is a diagram illustrating the magnetic fields created by the current illustrated in FIG. 6.

As illustrated in FIG. 6, a writing current 602 can flow in either direction along magnetic metal layer 102. As illustrated in FIG. 7, current 602 will create a magnetic field 704 within magnetic metal layer 102 and will also cause a magnetic field 702 to flow through magnetic sensing device 104. In FIG. 7, the current is shown flowing into the page creating clockwise magnetic field 702 and 704.

Magnetic field 704 created within magnetic metal layer 102 is proportional to the permeability of magnetic metal layer 102 in accordance with Ampere's law. The higher the permeability ($\mu$), the greater the magnetic field that is generated. Magnetic field 704 will leak from magnetic metal layers 102 at the boundary creating an external magnetic field 702 within magnetic sensing device 104 as illustrated. If the "leaked" magnetic field 702 is greater than the coercive field of magnetic sensing device 104, then programming can occur.

Figure 8:
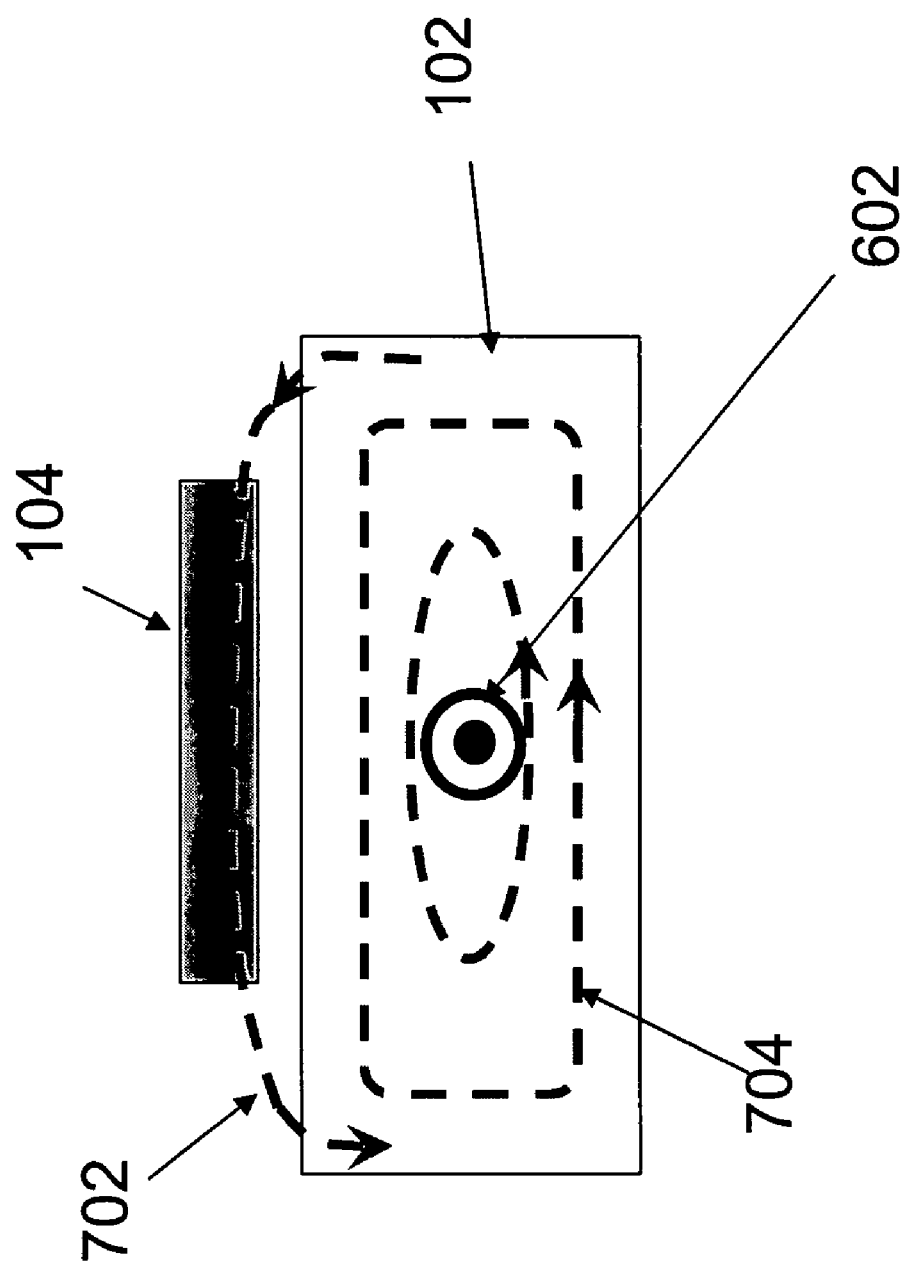
FIG. 8 is a diagram illustrating the magnetic fields created when the current illustrated in FIG. 6 is reversed.

In FIG. 8, current 602 is reversed such that it is coming out of the page, which creates counterclockwise magnetic field 704 within magnetic metal layer 102 and "leaked" magnetic field 702 within magnetic sensing device 104. Again, if the "leaked" field 702 is larger than the coercive field of magnetic sensing device 104 then programming can occur, this time to the opposite state that would result from magnetic field 702 illustrated in FIG. 7.

Using magnetic metal layer 102 to program magnetic sensing device 104 in this manner can significantly reduce, or even eliminate, cross talk between cells 100. Further, significantly lower currents are needed to create a sufficient magnetic field to overcome the coercive field of magnetic sensing device 104. For example a current of as little as 440 $\mu$A can generate a magnetic field 702 of 2,800 G; however, the magnetic field outside of a target cell 100 drops to almost zero with a log decay. As a result, using magnetic metal layer 102 in the manner described results in a low current, cross talk free MRAM cell 100.

In addition, only a single current line is needed to program magnetic sensing device 104 as opposed to two current lines as with conventional MRAM designs.

Figure 12:
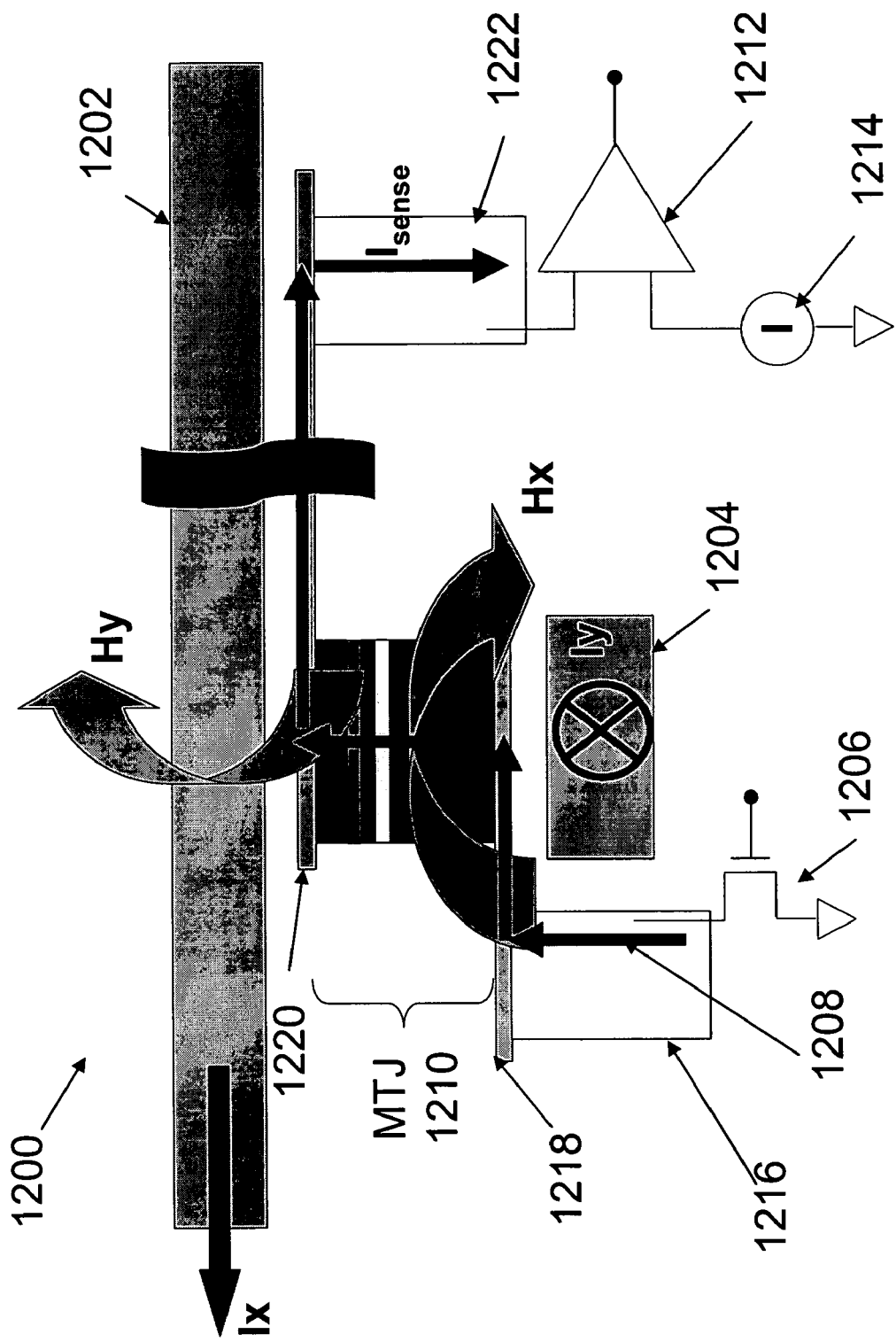
FIG. 12 is a diagram illustrating the reading and writing of a conventional MRAM cell.

Not only does cell 100 include fewer current lines and conventional MRAM cells, MRAM cell 100 also does not require separate writing and reading current paths as with conventional devices. The reading operation of a conventional cell 1200 is illustrated in FIG. 12. In order to read the state of magnetic sensing device 1210, a word line transistor 1206 and sense amplifier 1212 are required. When word line transistor 1206 is turned on, a current 1208 flows up through the cell and through magnetic sensing device 1210 and then down to current sense amplifier 1212, which can be configured to determine the programming state of magnetic sensing device 1210 based on the value of current 1208. As can be seen, read current 1208 flows through a different path than writing currents Ix and Iy flowing in current lines 1202 and 1204. Further, several layers 1216, 1218, 1220, and 1222 are needed within cell 1200 in order to provide a current path for current 1208 to flow through transistor 1206 and into sensing amplifier 1212.

Figure 9:
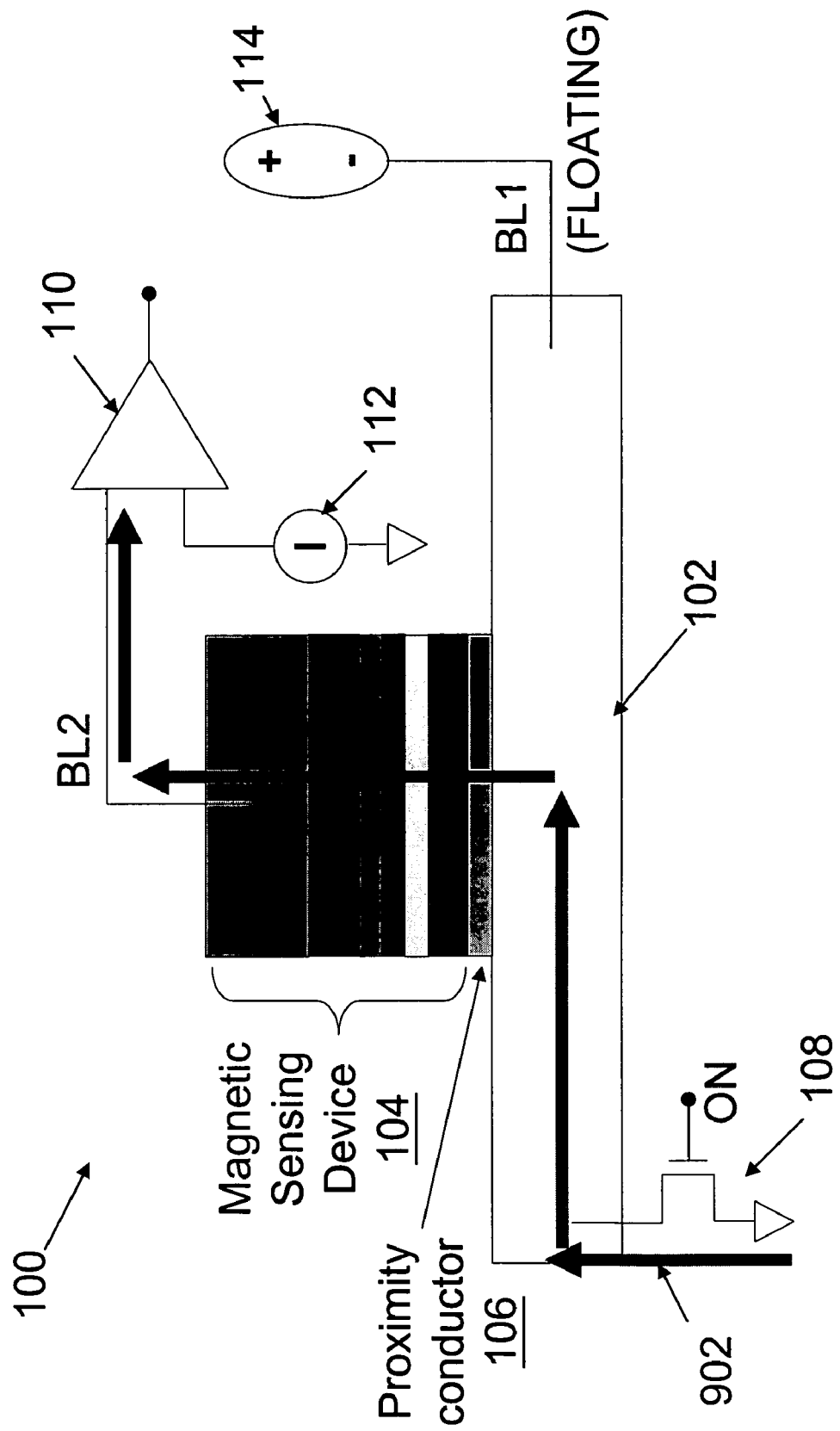
FIG. 9 is a diagram illustrating one example method for reading the MRAM cell of FIG. 1A.

FIG. 9 is a diagram illustrating how the state of magnetic sensing device 104 can be read in an MRAM cell 100 in accordance with one embodiment in the systems and methods described herein. Here, a turn on voltage can be applied to the gate of word line transistor 108, such as a 1.6 volts turn on voltage. A voltage difference can then be applied to magnetic metal layer 102 and magnetic sensing device 104. This will cause a current 902 to flow through word line transistor 108 into magnetic metal layer 102 and up into the magnetic sensing device 104 as illustrated. The current can then flow through BL2 and into sense amplifier 110, which can be configured to sense the state of magnetic sensing device 104. Sense amplifier 110 is configured to compare the current on BL2 to a reference current 112. By sensing the difference between the current on BL2 relative to reference current 112, sense amplifier 110 can be configured to distinguish the logic state of magnetic sensing device 104. BL1 can be left floating during this read operation.

Figure 10:
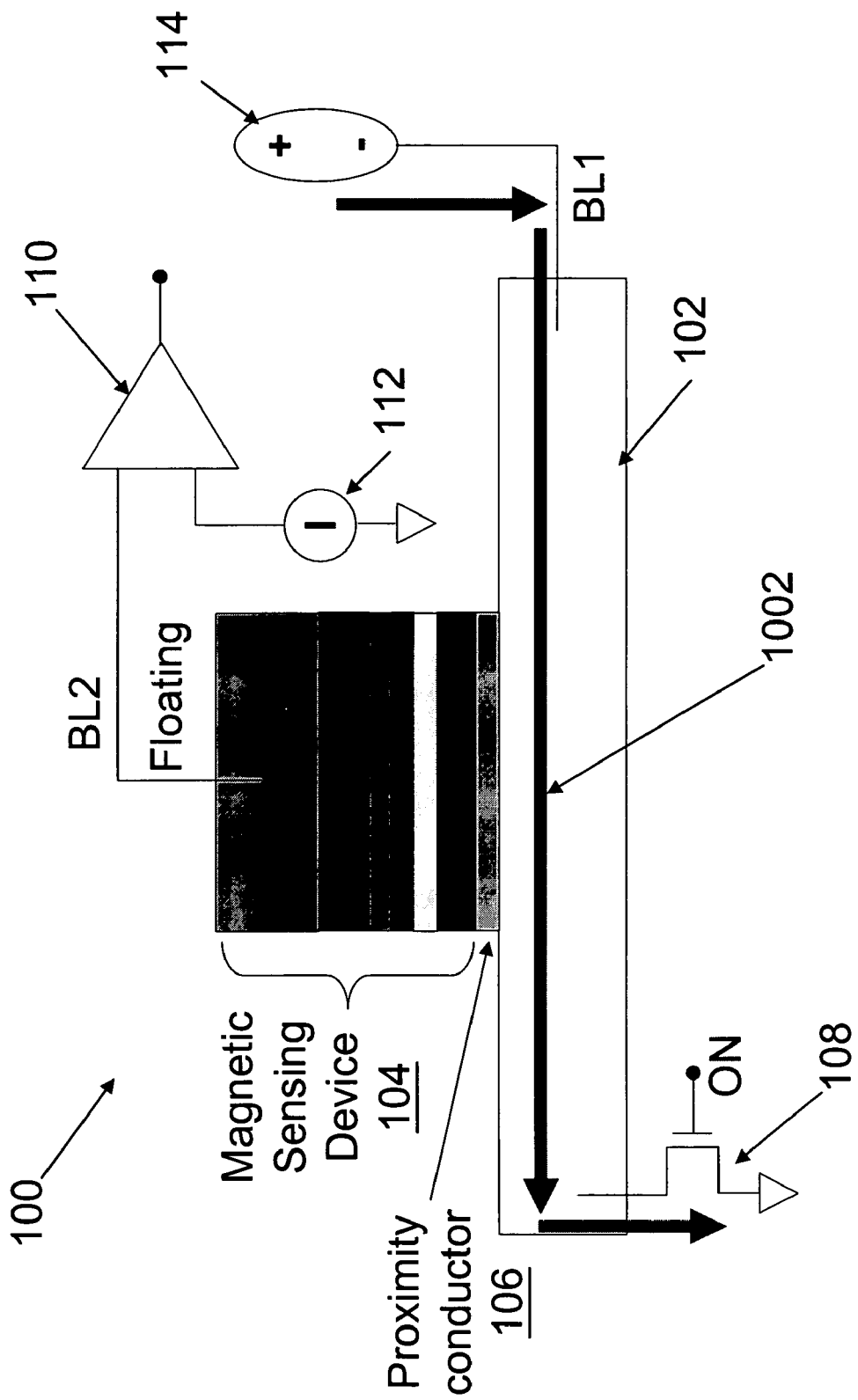
FIG. 10 is a diagram illustrating one example method of programming the MRAM cell of FIG. 1A to one state in accordance with one embodiment.

FIG. 10 is a diagram illustrating a write operation in which magnetic sensing device 104 is programmed to one of two programming states in accordance with one embodiment of the systems and methods described herein. Here, a turn on voltage, e.g., of 1.6 volts, can be applied to word line transistor 108 turning it on. A voltage difference is then applied to the other side of magnetic metal layer 102 via BL1. This causes a writing current 1002 to flow from BL1 through magnetic metal layer 102 to word line transistor 108. As explained above, current 1002 will create a magnetic field of sufficient strength to overcome the energy barrier of magnetic sensing device 104 and thus switch the magnetic moment vector for magnetic sensing device 104. For example, in one embodiment a 50 $\mu$A current 1002 is generated in magnetic metal layer 102. BL2 can be left floating through this operation.

Figure 11:
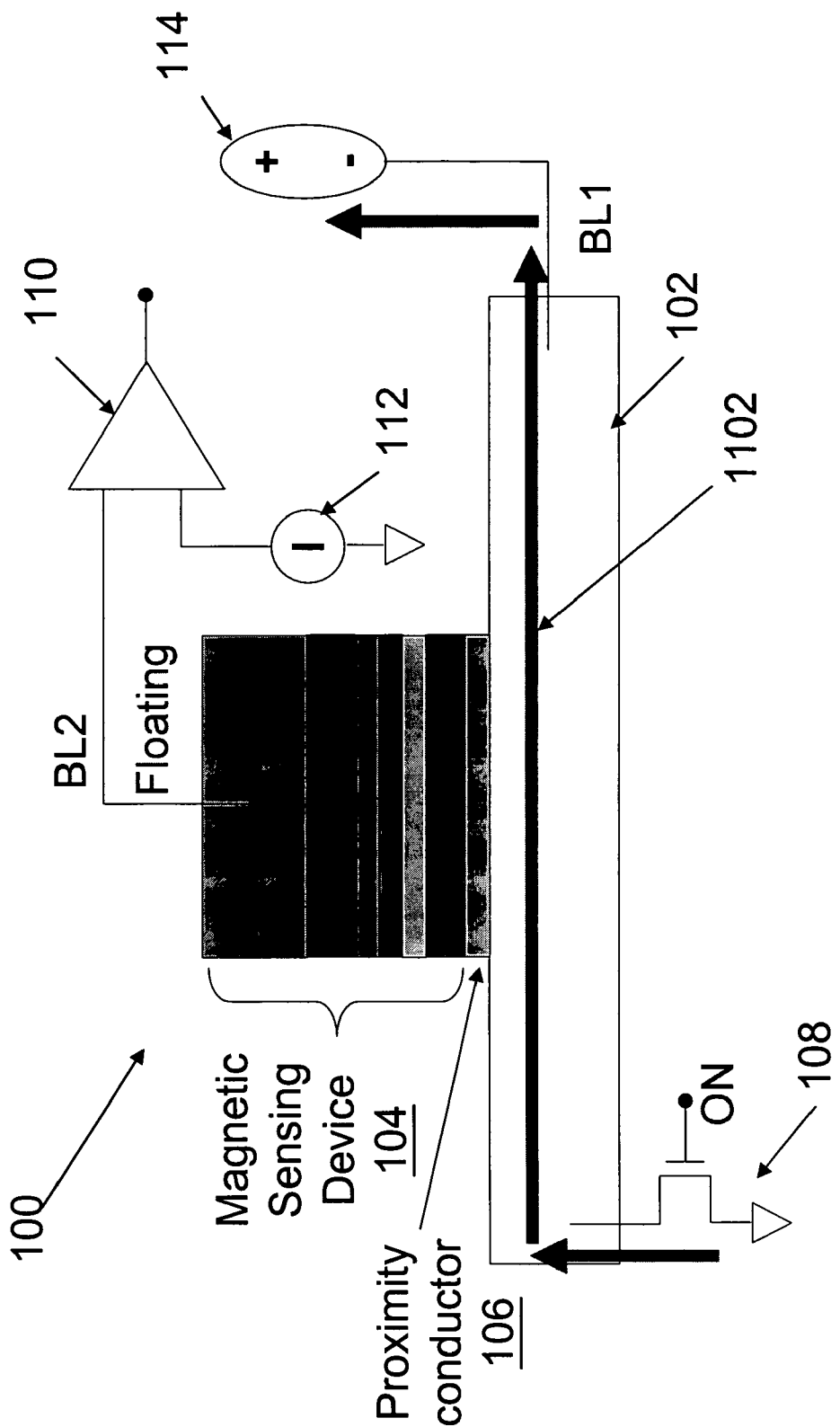
FIG. 11 is a diagram illustrating an example method for programming the MRAM cell of FIG. 1A to another state in accordance with one embodiment.

FIG. 11 is a diagram illustrating a writing operation in which magnetic sensing device 104 is programmed to the other state. Here the operation is similar to the operation depicted and described in relation to FIG. 10; however, the voltage difference applied to the other side of magnetic metal layer 102 via BL1 can be the opposite of the voltage difference applied in the process described in relation to FIG. 10. This will cause a writing current 1102 to flow in the opposite direction in magnetic metal layer 102 switching the magnetic moment vector of magnetic sensing device 104 and programming magnetic sensing device to the other state. BL2 can be left floating through this operation. Again, in one example embodiment a 50 $\mu$A current 1102 can be generated in order to program magnetic sensing device 104 to the other state.

As can be seen, not only does MRAM cell 100 include a single current line 102, it also eliminates the need for, and complexity associated with, having separate read and write paths through the cell.

By using the systems and methods described above, MRAM cells can be constructed that use a diode under the magnetic sensing device to perform the reading and writing of the cell in a manner that will allow the cell to be constructed with less metal bit lines, which can make the overall MRAM device less expensive, and with tunable writing performance, which can reduce the size and/or increase the density of the overall MRAM device. Further, such cells can result in very low currents, which enables portable applications, and as mentioned above can eliminate cross-talking issues, which again leads to higher densities and/or smaller MRAM devices.

Figure 13:
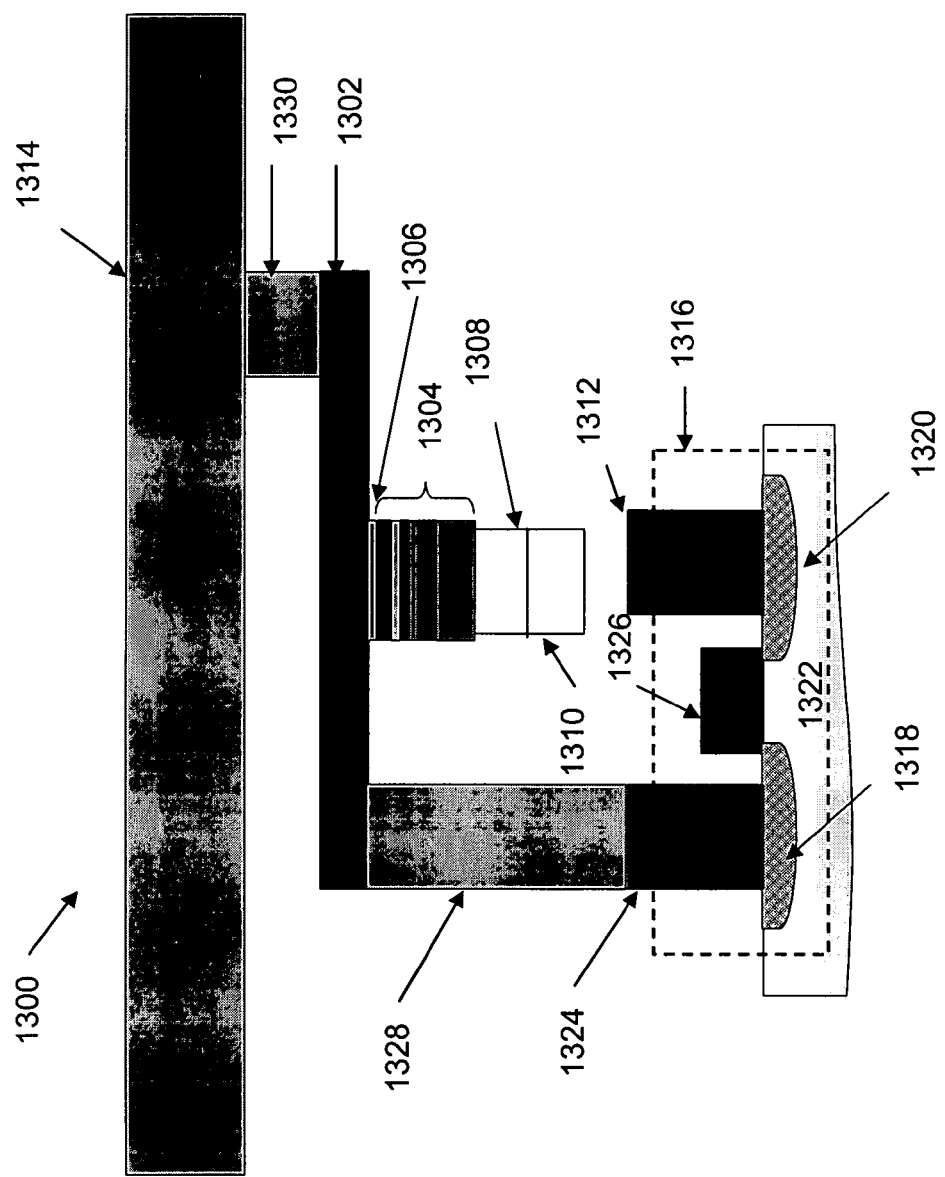
FIG. 13 is a diagram illustrating an example MRAM cell structure comprising a single word line transistor and a diode in accordance with one embodiment.

For example, FIG. 13 is a diagram illustrating a single transistor MRAM cell 1300 configured in accordance with one embodiment of the systems and methods described herein. As can be seen, MRAM cell 1300 comprises a magnetic metal layer 1302 separated from a magnetic sensing device 1304 by a proximity conductor 1306. Magnetic metal layer 1302 can be constructed from material and have properties similar to the embodiments described above. Similarly, proximity conductor 1306 and magnetic sensing device 1304 can be constructed from material and have properties similar to the embodiments described above. Magnetic sensing device 1304 is interfaced with a bit line 1310 via a diode 1308. A transistor 1316 is interfaced with one side of magnetic metal layer 1302 via a connecting layer 1328 as illustrated. The other side of magnetic metal layer 1302 is interfaced with a bit line 1314 via connecting layer 1330.

Transistor 1316 can be constructed from a silicon substrate 1322. Drain and source regions, 1318 and 1320 respectively, can be implanted into silicon substrate layer 1322 using well-known techniques. A gate layer 1326 can then be constructed on top of silicon substrate layer 1322 as illustrated. Drain and source connectors, 1324 and 1313 respectively, can then be formed over drain and source regions 1318 and 1320. Another bit line can be coupled with source 1320 via connector 1313.

Thus, bit line 1312 can be a first bit line (BL1), bit line 1310 can be a second bit line (BL2), and bit line 1314 can be a third bit line (BL3). BL1, BL2 and BL3 can be used to select MRAM cell 1300 for reading and writing as described in more detail below.

Transistor 1316 can be constructed using well-known semiconductor techniques. For example, co-pending U.S. patent application Ser. No. 11/255,606 describes example methods for constructing an MRAM cell including transistors such as transistor 1316. Accordingly, similar methods can be used to construct MRAM cell 1300, including transistor 1316.

Figure 14:
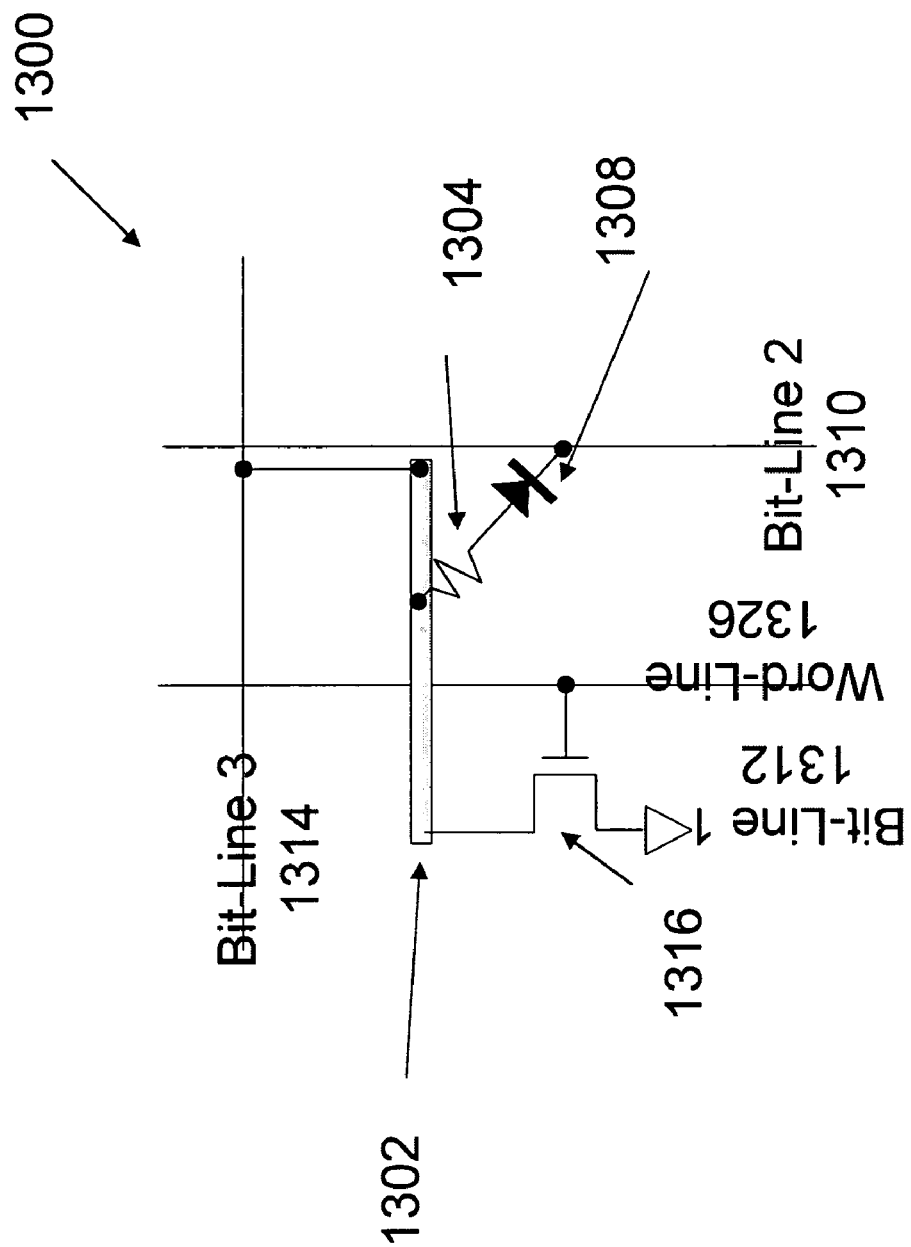
FIG. 14 is a diagram illustrating a schematic equivalent of the MRAM cell of FIG. 13.

FIG. 14 is a diagram illustrating the schematic equivalent of MRAM cell 1300. Thus, as can be seen MRAM cell 1300 can be represented as comprising a magnetic metal layer 1302, where one end of magnetic metal layer 1302 is connected to BL3 1314 via connecting layer 1330, while the other end of magnetic metal layer 1302 is interfaced with BL1 1312 by transistor 1316. Magnetic metal layer 1302 is also coupled with BL2 1310 via magnetic sensing device 1304, which can be represented as a resistor, and diode 1308. The gate of transistor 1316 can be interfaced with word line 1326 as illustrated.

Figure 15:
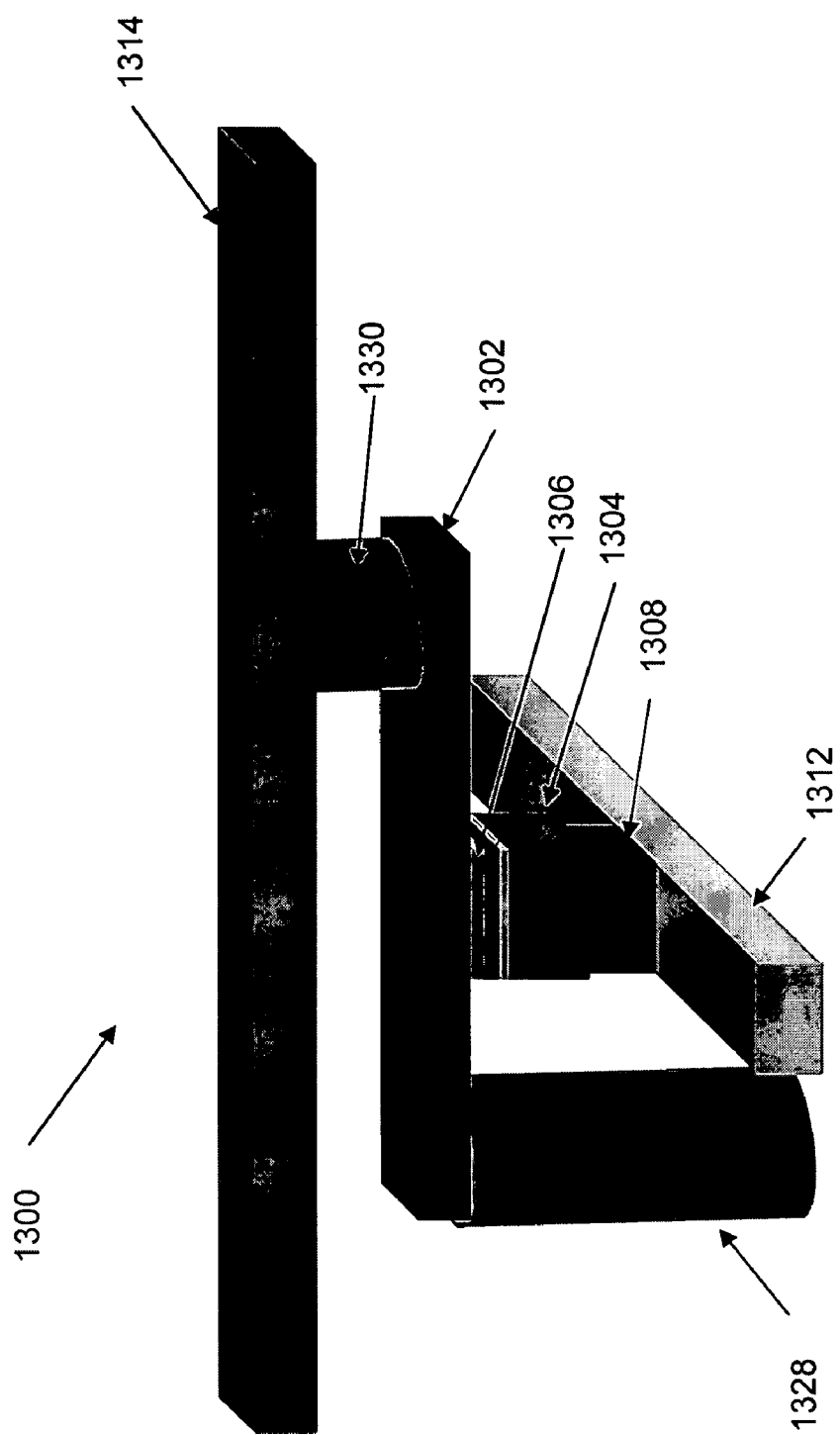
FIG. 15 is a diagram illustrating a partial 3-dimensional view of the MRAM cell of FIG. 13.
Figure 16:
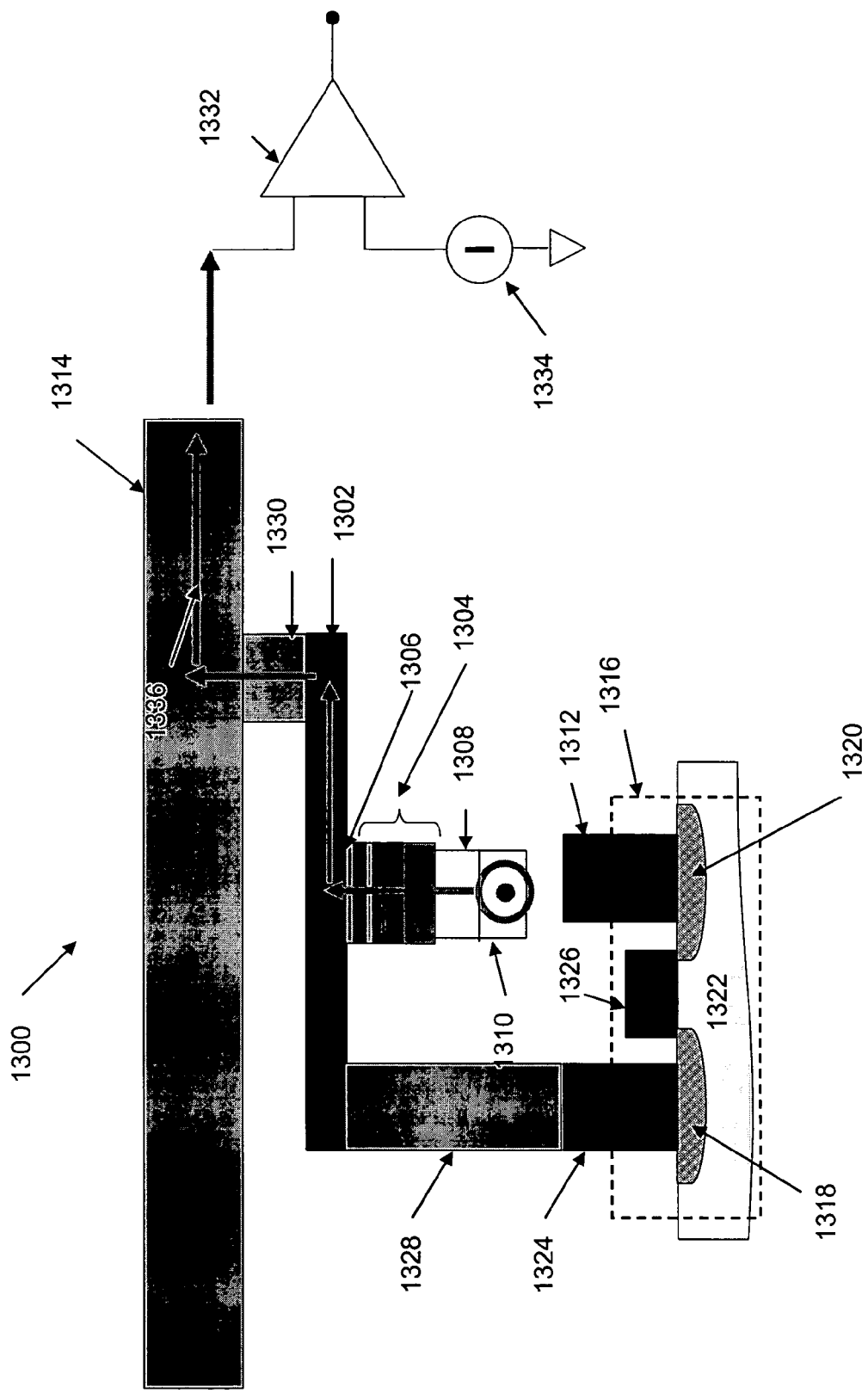
FIG. 16 is a diagram illustrating an example method for reading the MRAM cell of FIG. 13 in accordance with one embodiment.

FIG. 15 is a diagram illustrating a three-dimensional view of MRAM cell 1300. As can be seen, BL1 1312 (shown in FIG. 13) can be perpendicular to magnetic metal layer 1302 and BL3 1314. Thus, current running BL3 1314 and magnetic metal layer 1302 can run from left to right or right to left depending on the operation, whereas current end BL1 1312 can run into or out of a page as described in more detail below. As mentioned above, MRAM cell 1300, when configured in accordance with the systems and methods described herein, can reduce the number of metal lines required to implement MRAM cell 1300. For example, in one embodiment, BL2 1310 can be a p+ poly-silicon line as in the example of FIG. 16. FIG. 16 is a diagram illustrating a method of reading MRAM cell 1300, when BL2 1310 is a p+ poly-silicon line, in accordance with one embodiment of the systems and methods described herein. As can be seen, BL3 1314 can be coupled with a sense amplifier 1332, which can be configured to compare a read current 1336 with a reference current 1334. In order to generate read current 1336, a positive voltage difference can be applied between BL2 1310 and BL3 1314. This can cause a current to flow in BL2 1310 in a direction that is out of the page. The current can then flow from BL2 1310 to diode 1308, from diode 1308 to magnetic sensing device 1304, and into magnetic metal layer 1302 via proximity conductor 1306. The current can then flow through magnetic metal layer 1302 and into BL3 1314 through a connecting layer 1330.

During the read operation, a slightly negative bias can be applied to word line 1326. For example, in one embodiment, a negative bias such as—0.5V is applied to word line 1326 during the read operation illustrated in FIG. 16. Alternatively, word line 1326 can be grounded during the read operation. A ground, or a negative bias, is applied to word line 1326 in order to turn off transistor 1316 during the reading operation. BL1 1312 can be allowed to float, or in another embodiment can be grounded, during the read operation.

Using the read operation described in relation to FIG. 16, a read can be conducted using a relatively low read current. For example, in one embodiment a read current of approximately 0.5 µA is generated during the read operation. Sense amplifier 1332 can be configured to sense this relatively low read current and compare it with a reference current 1334 in order to distinguish the logic state of magnetic sensing device 1304. The current 1336 generated during the read operation will vary depending on the state of magnetic sensing device 1304.

It should be noted, that during a read operation, such as that illustrated with respect to FIG. 16, all BL1 1312 lines for all cells are floating, or grounded, and all word lines 1326 for all cells are slightly negative biased, or grounded, as described above. By applying a positive voltage difference between the correct BL2 1310 and BL3 1314 lines, the correct MRAM cell 1300 can then be read.

Figure 17:
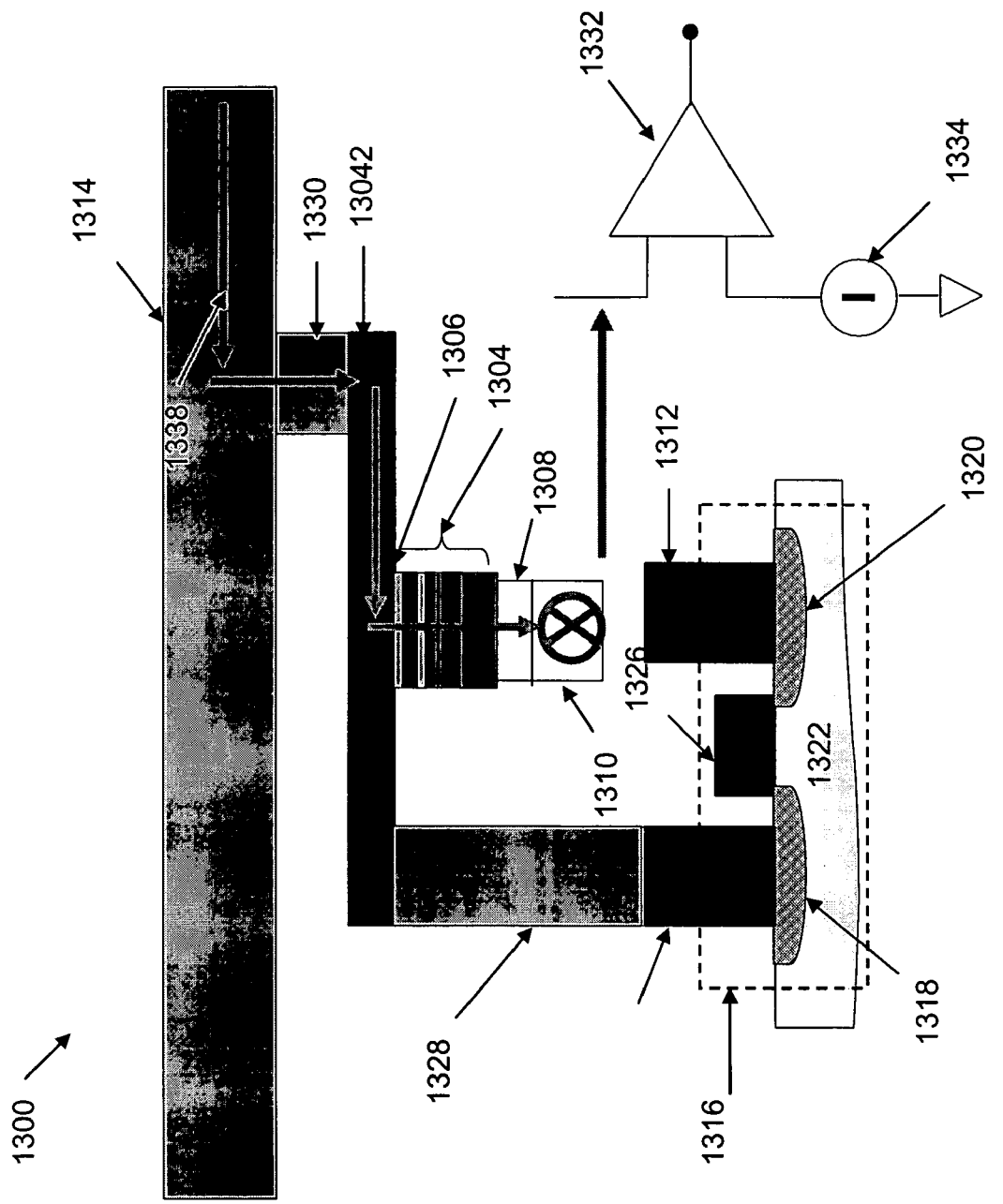
FIG. 17 is a diagram illustrating an example method for reading the MRAM cell of FIG. 13 in accordance with another embodiment.

In another embodiment, BL2 1310 can be an n+ poly-silicon line as in the example of FIG. 17. FIG. 17 is a diagram illustrating an example of read operation, where BL2 1310 is an n+ poly-silicon line, in accordance with one embodiment of the systems and methods described herein. In the example of FIG. 17, a negative voltage difference is applied between BL2 1310 and BL3 1314 which causes a read current to flow in BL2 1310 that is in a direction into the page. The negative voltage difference causes current 1338 to flow in BL3 1314 and down into magnetic metal layer 1302 through connecting layer 1330. Read current 1338 then flows from magnetic metal layer 1302 into magnetic sensing device 1304 via proximity conductor 1306. The current can then flow from magnetic sensing device 1304, through diode 1308, and into BL2 1310.

Again, word line 1326 can be slightly negative biased, e.g., a negative bias of approximately −0.5V can be applied to word line 1326, depending on the embodiment. In other embodiments, word line 1326 can be grounded in order to turn off transistor 1316. BL1 1312 can be allowed to float or be tied to ground, depending on the embodiment.

Application of the negative voltage difference applied between BL2 1310 and BL3 1314 can cause a relatively low read current 1338 to be generated that can be sensed by sense amplifier 1332 in order to determine the logic state of magnetic sensing device 1304. Again, this read current can be approximately 0.5 µA as in the embodiment of FIG. 16. Also, all BL1 1312 lines for all cells can be left floating, or grounded, during the read operation, and all word lines 1326 of all cells can be slightly negative biased, or grounded, during the read operation, allowing the correct MRAM cell 1300 to be selected by applying a negative voltage between the correct BL2 1310 and BL3 1314 lines.

Figure 18:
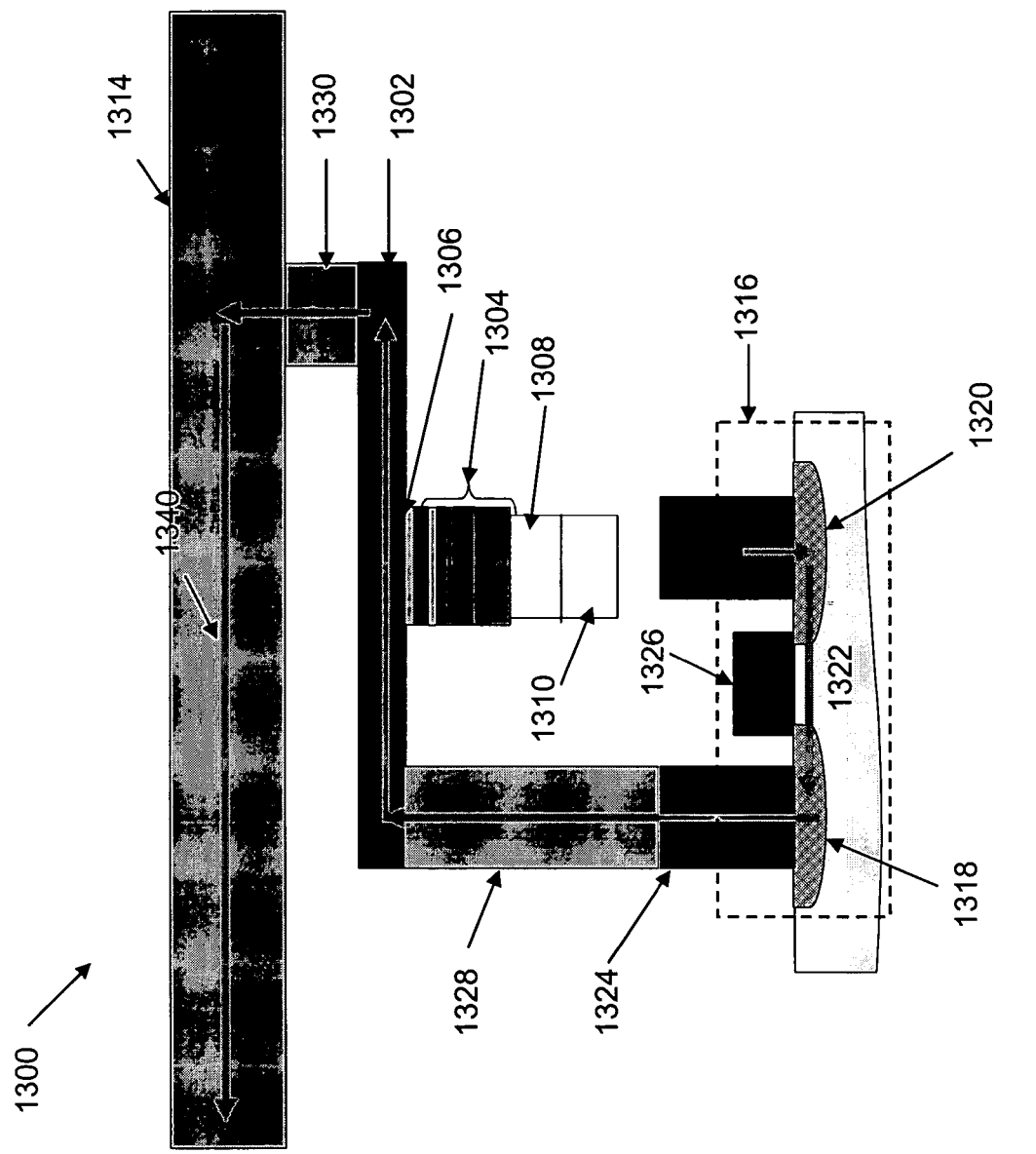
FIG. 18 is a diagram illustrating an example method for programming the MRAM cell of FIG. 13 to one state in accordance with one embodiment.

FIG. 18 is a diagram illustrating an example method for programming MRAM cell 1300 to one of two possible states in accordance with one embodiment of the systems and methods described herein. In other words, the process described in relation to FIG. 18 can be used to program magnetic sensing device 1304 to one of two possible states. Magnetic sensing device 1304 can be programmed using the principles described above. Thus, in order to program MRAM cell 1300 to one of two possible states, a turn on voltage can be applied to word line 1326. For example, in one embodiment, the turn on voltage can be approximately 1.6V. At the same time, a positive voltage difference can be applied to BL1 1312 and BL3 1314, while BL2 1310 is allowed to float.

The positive voltage difference applied between BL1 1312 and BL3 1314, as well as the turn on voltage applied to word line 1326, causes a write current 1340 to flow from BL1 1312 through transistor 1316 from source 1320 to drain 1318, and up to magnetic metal layer 1302 via drain contact 1324 and connecting layer 1328. The current then flows from magnetic metal layer 1302 up to BL3 1314 through connecting layer 1330 as illustrated.

By implementing the systems and methods described herein, a relatively low write current can be generated that is sufficient to program magnetic sensing device 1304. For example, a write current of approximately 50 µA can be sufficient to program magnetic sensing device 1304. As explained above, magnetic sensing device 1304 is programmed by the magnetic field generated by write current 1340. The state of magnetic sensing device 1304 depends on the direction of the magnetic field generated by write current 1340, which is dependent on the direction the current is flowing in magnetic metal layer 1302. Thus, in the embodiment of FIG. 18, magnetic sensing device 1304 would be programmed to one of two states associated with a current flowing from left to right as illustrated.

When performing the write operation depicted in FIG. 18, all BL2 1310 lines of all cells can be left floating. The word lines of the other cells, however, can be slightly negative biased during the write operation. For example, a negative bias of approximately −0.5V can be applied to the word lines of other MRAM cells during a write operation for MRAM cell 1300. In other embodiments, the word lines of the other cells can be grounded. The purpose of the negative bias, or grounding, is to ensure that the transistors 1316 of the other cells are turned off during a write operation for MRAM cell 1300.

FIG. 19 is a diagram illustrating an example method for writing MRAM cell 1300 to the other of two possible states in accordance with one embodiment to the systems and methods described herein. As can be seen, the method of FIG. 19 results in a write current 1342 that flows through magnetic metal layer 1302 from right to left. Thus, write current 1342 can program magnetic sensing device 1304 to the other of two possible states associated with a write current flowing from right to left in magnetic metal layer 1302.

In order to generate write current 1342, a turn on voltage, such as a turn on voltage of approximately 1.6V, can be applied to word line 1326. A negative voltage difference can then be applied between BL1 1312 and BL3 1314, while BL2 1310 is allowed to float. This will cause write current 1342 to flow from BL3 1314 into magnetic metal layer 1302 through connecting layer 1330. Write current 1342 will then flow into drain 1318 of transistor 1316 through connecting layer 1328 and drain connector 1324. Write current 1342 will then flow from drain 1318 to source 1320, and then to BL1 1312 as illustrated.

Again, write current 1342 can be relatively low, e.g., approximately 50 µA, and is flowing from right to left.

As with the write operation of FIG. 19, all BL2 1310 lines of all cells can be left floating during the writing operation, while the word lines of other cells can be slightly negative biased, e.g., −0.5V, or grounded, in order to turn off the transistors 1316 of other MRAM cells during the write operation for MRAM cell 1300.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A non-volatile memory cell, comprising:
 a word line transistor comprising a gate, a source, and a drain;
 a magnetic metal layer, wherein one end of the magnetic metal layer is coupled with word line transistor;
 a magnetic sensing device separated from the magnetic metal layer by a proximity conductor;
 a first bit line;
 a diode configured to couple the magnetic sensing device to the first bit line; and
 a second bit line coupled with the other end of the magnetic metal layer.

2. The non-volatile memory cell of claim 1, further comprising a third bit line, wherein the source of the word line transistor is coupled with the third bit line.

3. The non-volatile memory cell of claim 2, wherein the source is coupled with the third bit line via a source connector.

4. The non-volatile memory cell of claim 1, wherein the magnetic metal layer is coupled with the word line transistor via a drain connector.

5. The non-volatile memory cell of claim 1, wherein the magnetic metal layer comprises a material having a permeability in the range of in the range from about 10 to $10^8$.

6. The non-volatile memory cell of claim 1, wherein the magnetic metal layer comprises a material having a resistivity in the range of about 4 µΩ-cm to $10^8$ µΩ-cm.

7. The non-volatile memory cell of claim 1, wherein the magnetic metal layer can include at least one of Ni, Fe, Co, B, Mo, Zn, Pb, Si, C, and O.

8. The non-volatile memory cell of claim 1, wherein the magnetic metal layer comprises a material having a saturation magnetization (Ms) ranging from about 10 Guass to about 2.5 Tesla.

9. The non-volatile memory cell of claim 1, wherein the proximity conductor comprises metal, a conductive compound, or a semi-conductor material.

10. The non-volatile memory cell of claim 1, wherein the proximity conductor comprises at least one of Cu, TiN, TaN, Si, W, Ag, Ru, Ir, and Pt.

11. The non-volatile memory cell of claim 1, wherein the proximity conductor comprises a material comprising a resistivity in the range of about 1 to $10^{10}$ µΩ-cm.

12. The non-volatile memory cell of claim 1, wherein the magnetic sensing device comprises a Magnetic Tunnel Junction (MTJ) device, a Giant Magnetoresistance (GMR) device, a Colossal Magnetoresistance (CMR) device, Anisotropic Magnetoresistance (AMR) device, Magneto-optical (MO) element, or a Magnetic disk.

13. The non-volatile memory cell of claim 12, wherein the MTJ device comprises a first ferromagnetic layer, an insulating layer, and a second ferromagnetic layer.

14. The non-volatile memory cell of claim 13, wherein the MTJ device further comprises an anitferromagnetic layer adjacent the first or second ferromagnetic layer.

15. The non-volatile memory cell of claim 13, wherein the insulator of the MTJ device can be Al2O3 or MgO.

16. The non-volatile memory cell of claim 12, wherein the GMR device comprises a first ferromagnetic layer, an thin conductive layer, and a second ferromagnetic layer.

17. The non-volatile memory cell of claim 16, wherein the GMR device further comprises an anitferromagnetic layer adjacent the first or second ferromagnetic layer.

18. In a non-volatile memory cell comprising a magnetic metal layer separated from a magnetic sensing device by a proximity conductor, a method for reading the state of the magnetic sensing device, comprising:
applying a voltage difference between a first bit line coupled with the magnetic sensing device via a diode and a second bit line coupled with one end of the magnetic metal layer; and
applying a turn off voltage to the gate of a transistor coupled with the other end of the magnetic metal layer.

19. The method of claim 18, wherein the first bit line is an n+ poly-silicon line, and when applying a voltage difference comprises applying a negative voltage difference.

20. The method of claim 18, wherein the first bit line is a p+ poly-silicon line, and wherein applying the voltage difference comprises applying a positive voltage difference.

21. The method of claim 18, wherein the turn off voltage applied to the gate of the transistor is a slightly negative biased voltage of approximately 0V and ground.

22. The method of claim 18, further comprising allowing a third bit line coupled with the source of the transistor to float while the positive voltage difference and turn off voltage are applied.

23. The method of claim 18, further comprising grounding the source of the transistor while the positive voltage difference and turn off voltage are applied.

24. The method of claim 18, further comprising coupling the first bit line to a sense amplifier.

25. The method of claim 24, further comprising detecting a current from the first bit line using the sense amplifier.

26. In a non-volatile memory cell comprising a magnetic metal layer separated from a magnetic sensing device by a proximity conductor, a method for programming the magnetic sensing device, comprising:
applying a turn on voltage to the gate of a transistor coupled with one end of the magnetic metal layer; and
applying a voltage difference between a bit line coupled with a source of the transistor and a second bit line coupled with the other end of the magnetic metal layer.

27. The method of claim 26, wherein the voltage difference is a positive voltage difference.

28. The method of claim 26, wherein the voltage difference is a negative voltage difference.

29. The method of claim 26, further comprising letting a third bit line coupled with the magnetic sensing device via a diode float.

30. The method of claim 26, further comprising applying a turn off voltage to word line transistors included in other non-volatile memory cells that form a part of the same memory device as the non-volatile memory cell.

31. The method of claim 30, wherein the turn off voltage is a slightly negative biased voltage of approximately 0V and ground.

* * * * *